(12) United States Patent
Sugiyama et al.

(10) Patent No.: US 9,531,344 B2
(45) Date of Patent: Dec. 27, 2016

(54) SIGNAL PROCESSING APPARATUS, SIGNAL PROCESSING METHOD, STORAGE MEDIUM

(75) Inventors: Akihiko Sugiyama, Tokyo (JP); Ryoji Miyahara, Tokyo (JP)

(73) Assignee: NEC CORPORATION, Tokyo (JP)

( * ) Notice: Subject to any disclaimer, the term of this patent is extended or adjusted under 35 U.S.C. 154(b) by 324 days.

(21) Appl. No.: 14/001,508

(22) PCT Filed: Dec. 19, 2011

(86) PCT No.: PCT/JP2011/079387
§ 371 (c)(1),
(2), (4) Date: Aug. 25, 2013

(87) PCT Pub. No.: WO2012/114628
PCT Pub. Date: Aug. 30, 2012

(65) Prior Publication Data
US 2013/0332500 A1  Dec. 12, 2013

(30) Foreign Application Priority Data
Feb. 26, 2011  (JP) .................................. 2011-041002

(51) Int. Cl.
*H03H 17/06* (2006.01)
*G10L 21/0208* (2013.01)
*G10L 25/18* (2013.01)

(52) U.S. Cl.
CPC .......... *H03H 17/06* (2013.01); *G10L 21/0208* (2013.01); *G10L 25/18* (2013.01)

(58) Field of Classification Search
CPC ......... G10L 21/0208–21/0216; G10L 21/0232; G10L 21/0316–21/034; G10L 25/03; G10L 25/18; G10L 25/21
See application file for complete search history.

(56) References Cited

U.S. PATENT DOCUMENTS 5,539,859 A * 7/1996 Robbe et al. ................. 704/233
5,878,389 A * 3/1999 Hermansky et al. ......... 704/226
(Continued)

FOREIGN PATENT DOCUMENTS

EP  2 346 032 A1  7/2011
JP  H 1-174110 A  7/1989
(Continued)

OTHER PUBLICATIONS

R. Martin, "Spectral subtraction based on minimum statistics," EUSPICO-94, pp. 1182-1185, Sep. 1994.
(Continued)

*Primary Examiner* — Matthew Sandifer
(74) *Attorney, Agent, or Firm* — McGinn IP Law Group, PPLC.

(57) ABSTRACT

To obtain a high-quality enhanced signal, disclosed is a signal processing apparatus including a transform unit that transforms a mixed signal in which a first signal and a second signal coexist, into a phase component and a magnitude component or power component for each frequency, a first control unit that replaces the phase component of a predetermined frequency, a second control unit that modifies the magnitude component or power component of the predetermined frequency in accordance with the amount of a change of the magnitude component or power component that arises from replacement by the first control unit, and a reconstruction unit that reconstructs the phase component replaced by the first control unit and the magnitude component or power component modified by the second control unit.

20 Claims, 20 Drawing Sheets

(56) References Cited

U.S. PATENT DOCUMENTS

| | | |
|---|---|---|
| 6,334,105 B1 | 12/2001 | Ehara |
| 6,526,378 B1* | 2/2003 | Tasaki .......................... 704/224 |
| 7,209,567 B1* | 4/2007 | Kozel et al. ................. 381/94.3 |
| 2009/0196434 A1 | 8/2009 | Sugiyama et al. |
| 2010/0014681 A1* | 1/2010 | Sugiyama ....................... 381/56 |
| 2010/0030562 A1 | 2/2010 | Yoshizawa et al. |
| 2010/0254541 A1* | 10/2010 | Hayakawa .................. 381/71.1 |
| 2011/0125490 A1* | 5/2011 | Furuta et al. ................. 704/205 |

FOREIGN PATENT DOCUMENTS

| | | |
|---|---|---|
| JP | 2002-23800 A | 1/2002 |
| JP | 2004-272292 A | 9/2004 |
| JP | 2007-79606 A | 3/2007 |
| JP | 2009-122710 A | 6/2009 |
| JP | 2009-230154 A | 10/2009 |
| JP | 2010-186190 A | 8/2010 |
| WO | WO 2007/26691 A1 | 3/2007 |
| WO | WO 2007/029536 A1 | 3/2007 |
| WO | WO 2009/034686 A1 | 3/2009 |
| WO | WO 2010/046954 A1 | 4/2010 |

OTHER PUBLICATIONS

M. Kato, et al, "Noise suppression with high speech quality based on weighted noise estimation and MMSE STSA," IEICE Trans. Fundamentals (Japanese Edition), vol. J87-A, No. 7, pp. 851-860, Jul. 2004.

Akihiko Sugiyama, "Single-Channel Impact-Noise Suppression with No Auxiliary Information for Its Detection," Proc. IEEE Workshop on Applications of Signal Processing to Audio and Acoustics (WASPAA), pp. 127-130, Oct. 2007.

Japanese Office Action dated Oct. 27, 2015 with an English translation thereof.

* cited by examiner

SIGNAL PROCESSING APPARATUS, SIGNAL PROCESSING METHOD, STORAGE MEDIUM

TECHNICAL FIELD

The present invention relates to a signal processing technique for controlling the phase component of a signal.

BACKGROUND ART

As examples of a technique for performing signal processing by controlling the phase component of a signal, patent literature 1 and non-patent literature 1 disclose noise suppression techniques which pay attention to a phase spectrum. In patent literature 1 and non-patent literature 1, a magnitude spectrum pertaining to noise is suppressed, and at the same time, the phase spectrum is shifted by a random value of up to $\pi/4$. Shifting the phase spectrum at random implements suppression of noise which cannot be suppressed by only attenuation of the noise spectrum.

CITATION LIST

Patent Literature

Patent literature 1: WO2007/029536

Non-Patent Literature

Non-patent literature 1: Akihiko Sugiyama, "Single-Channel Impact-Noise Suppression with No Auxiliary Information for Its Detection," Proc. IEEE Workshop on Appl. of Sig. Proc. to Audio and Acoustics (WASPAA), pp. 127-130, October 2007.

SUMMARY OF THE INVENTION

Technical Problem

However, when the phase spectrum is shifted at random, as in patent literature 1 and non-patent literature 1, a mismatch of the phase spectrum occurs between adjacent frames and the signal level drops in frame reconstruction. As a result, the output signal level differs between a noise suppression section and a noise non-suppression section, degrading the quality of an output signal.

The present invention enables to provide a signal processing technique of solving the above-described problem.

Solution to Problem

One aspect of the present invention provides a signal processing apparatus comprising:
a transform unit that transforms a mixed signal in which a first signal and a second signal coexist, into a phase component and a magnitude component or power component for each frequency;
a first control unit that replaces the phase component of a predetermined frequency;
a second control unit that modifies the magnitude component or power component of the predetermined frequency in accordance with an amount of a change of the magnitude component or power component that arises from replacement by the first control unit; and
a reconstruction unit that reconstructs the phase component replaced by the first control unit and the magnitude component or power component modified by the second control unit.

Another aspect of the present invention provides a signal processing method comprising:
transforming a mixed signal in which a first signal and a second signal coexist, into a phase component and a magnitude component or power component for each frequency;
replacing the phase component of a predetermined frequency;
modifying the magnitude component or power component of the predetermined frequency in accordance with an amount of a change of the magnitude component or power component that arises from replacement in the replacing; and
reconstructing the phase component replaced in the replacing and the magnitude component or power component modified in the modifying.

Still other aspect of the present invention provides a non-transitory computer-readable storage medium storing a signal processing program that causes a computer to execute:
transforming a mixed signal in which a first signal and a second signal coexist, into a phase component and a magnitude component or power component for each frequency;
replacing the phase component of a predetermined frequency;
modifying the magnitude component or power component of the predetermined frequency in accordance with an amount of a change of the magnitude component or power component that arises from replacement in the replacing; and
reconstructing the phase component replaced in the replacing and the magnitude component or power component modified in the modifying.

Advantageous Effects of Invention

The present invention can provide a signal processing technique for controlling the phase component of an input signal without degrading the quality of an output signal.

DESCRIPTION OF EMBODIMENTS

Preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

First Embodiment

Figure 1:
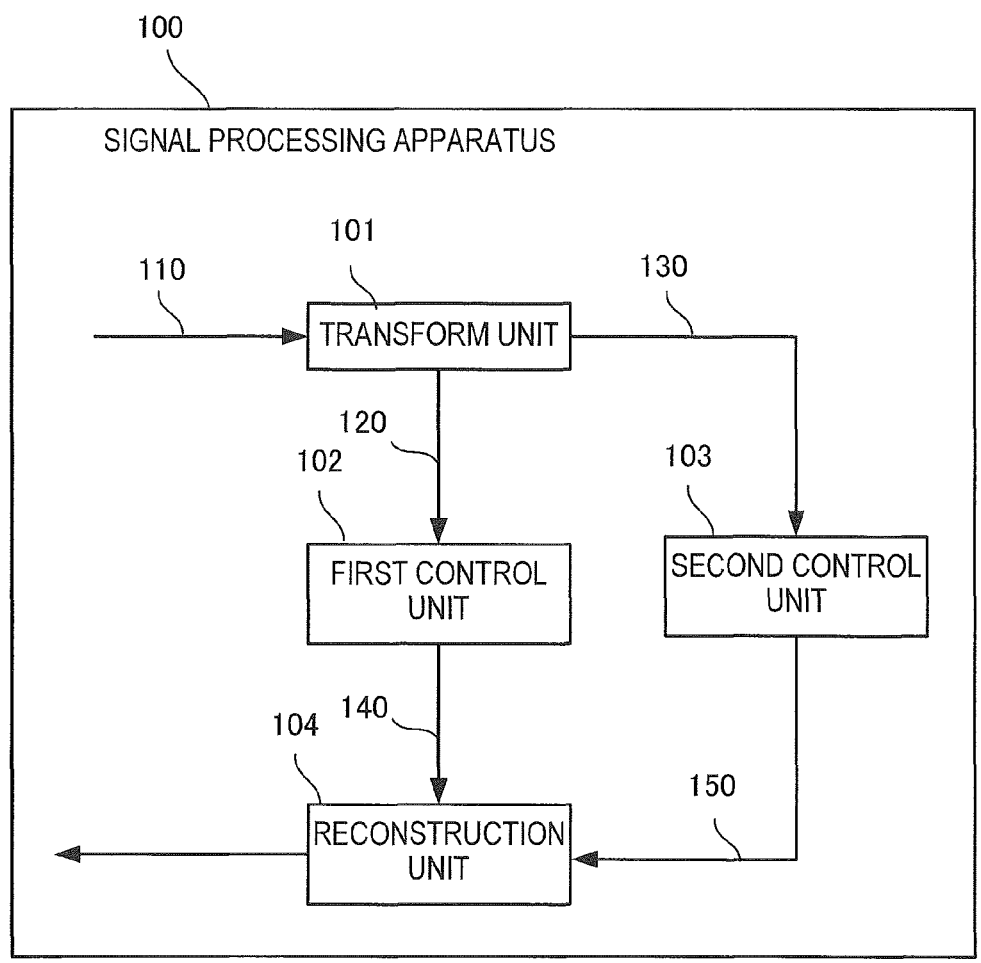
FIG. 1 is a block diagram showing the schematic arrangement of a signal processing apparatus according to the first embodiment of the present invention.

FIG. 1 is a block diagram showing the schematic arrangement of a signal processing apparatus 100 according to the first embodiment of the present invention. In FIG. 1, the signal processing apparatus 100 includes a transform unit 101, first control unit 102, second control unit 103, and reconstruction unit 104. The transform unit 101 transforms a mixed signal 110 in which the first and second signals coexist, into a phase component 120 and a magnitude component or power component 130 for each frequency. The first control unit 102 replaces the phase component 120 of a predetermined frequency. The second control unit 103 modifies a magnitude component or power component of the predetermined frequency in accordance with the amount of a change of the magnitude component or power component that arises from the replacement performed by the first control unit 102. The reconstruction unit 104 reconstructs a phase component 140 replaced by the first control unit 102 and a magnitude component or power component 150 modified by the second control unit 103.

With this arrangement, the first embodiment can provide a signal processing technique for controlling the phase component of an input signal without degrading the quality of an output signal.

Second Embodiment

Overall Arrangement

Figure 2:
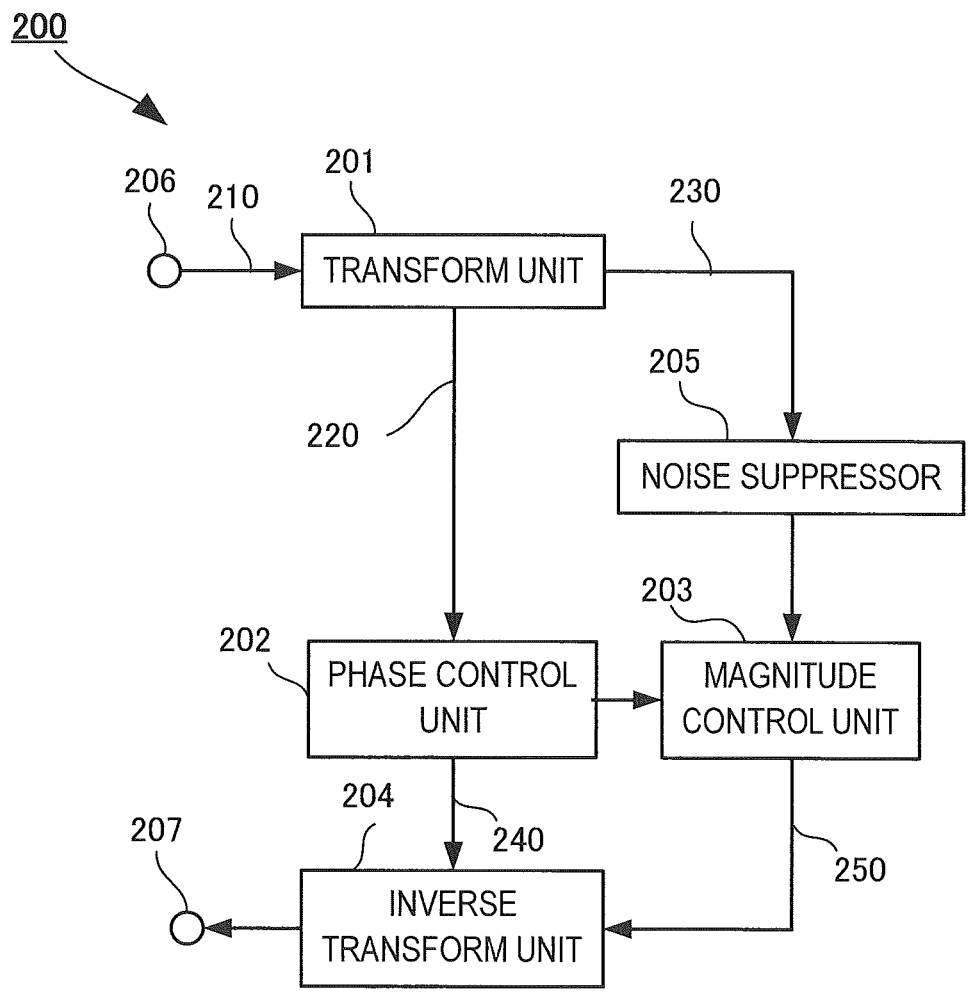
FIG. 2 is a block diagram showing the schematic arrangement of a noise suppression apparatus according to the second embodiment of the present invention.

A noise suppression apparatus according to the second embodiment of the present invention will be described with reference to FIGS. 2 to 11. FIG. 2 is a block diagram showing the overall arrangement of a noise suppression apparatus 200. The noise suppression apparatus 200 according to the embodiment functions as part of an apparatus such as a digital camera, a notebook computer, or a mobile phone. However, the present invention is not limited to this, and is applicable to all information processing apparatus requested to remove noise from an input signal.

A noisy signal (signal in which a target signal and noise coexist) is supplied as a series of samples to an input terminal 206. A transform unit 201 performs transform such as Fourier transform for the noisy signal supplied to the input terminal 206, and divides the noisy signal into a plurality of frequency components. The frequency components are processed independently for each frequency. The following description pays attention to a specific frequency component. Of the frequency component, a magnitude spectrum (magnitude component) 230 is supplied to a noise suppressor 205, and a phase spectrum (phase component) 220 is supplied to a phase control unit 202. Although the noisy signal magnitude spectrum 230 is supplied to the noise suppressor 205, the present invention is not limited to this, and a power spectrum corresponding to the square of the magnitude spectrum may be supplied to the noise suppressor 205.

The noise suppressor 205 estimates noise by using the noisy signal magnitude spectrum 230 supplied from the transform unit 201, and generates an estimated noise spectrum. The noise suppressor 205 suppresses noise by using the noisy signal magnitude spectrum 230 supplied from the transform unit 201, and the generated estimated noise spectrum, and transmits an enhanced signal magnitude spectrum serving as the noise suppression result to a magnitude control unit 203. The phase control unit 202 replaces the noisy signal phase spectrum 220 supplied from the transform unit 201, and supplies it as an enhanced signal phase spectrum 240 to an inverse transform unit 204. Also, the phase control unit 202 calculates the rotation amount (shift amount) of the phase from the noisy signal phase spectrum 220 and enhanced signal phase spectrum 240, and transmits it to the magnitude control unit 203. The magnitude control unit 203 receives the rotation amount (shift amount) of the phase from the phase control unit 202, and calculates a magnitude modification amount. Then, the magnitude control unit 203 modifies the enhanced signal magnitude spectrum for each frequency by using the magnitude modification amount, and supplies a modified magnitude spectrum 250 to the inverse transform unit 204. The inverse transform unit 204 performs inverse transform by reconstructing the enhanced signal phase spectrum 240 supplied from the phase control unit 202 and the modified magnitude spectrum 250 supplied from the magnitude control unit 203, and supplies the resultant signal as an enhanced signal to an output terminal 207.

<<Arrangement of Transform Unit>>

Figure 3:
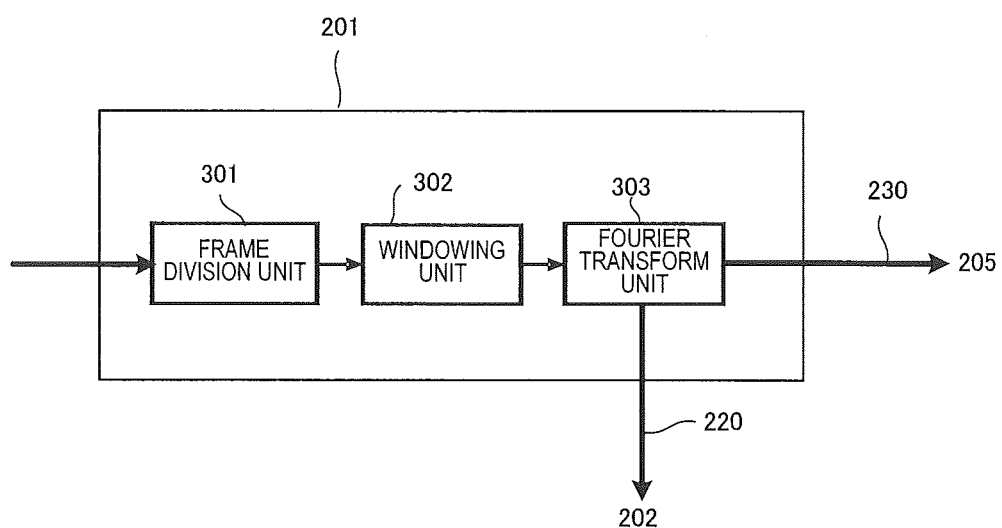
FIG. 3 is a block diagram showing the arrangement of a transform unit according to the second embodiment of the present invention.

FIG. 3 is a block diagram showing the arrangement of the transform unit 201. As shown in FIG. 3, the transform unit 201 includes a frame division unit 301, windowing unit 302, and Fourier transform unit 303. A noisy signal sample is supplied to the frame division unit 301 and divided into frames for every K/2 samples, in which K is an even number. The noisy signal sample divided into frames is supplied to the windowing unit 302 and multiplied by a window function w(t). A signal obtained by windowing an input signal $y_n(t)$ (t=0, 1, ..., K/2−1) of the nth frame by w(t) is given by equation (1):

$$\bar{y}_n(t) = w(t) y_n(t) \quad (1)$$

Two successive frames may be partially superimposed (overlap) and windowed. Assuming that the overlapping length is 50% of the frame length, a left-hand side obtained for t=0, 1, ..., K/2−1 based on equations (2) serves as an output from the windowing unit 302:

$$\left. \begin{array}{l} \bar{y}_n(t) = w(t) y_{n-1}(t + K/2) \\ \bar{y}_n(t + K/2) = w(t + K/2) y_n(t) \end{array} \right\} \quad (2)$$

For a real signal, a symmetric window function is used. The window function is designed so that, when a spectral gain in the MMSE STSA method is set to 1 or when 0 is subtracted in the SS method, an input signal and output signal coincide with each other, excluding a calculation error. This means w(t)+w(t+K/2)=1.

The following description will continue on the assumption that two successive frames are made to overlap each other by 50% and windowed. As w(t), for example, a Hanning window given by equation (3) is usable:

$$w(t) = \begin{cases} 0.5 + 0.5\cos\left(\dfrac{\pi(t - K/2)}{K/2}\right), & 0 \le t < K \\ 0, & \text{otherwise} \end{cases} \quad (3)$$

In addition, various window functions are known, including a Hamming function and triangle window. The windowed output is supplied to the Fourier transform unit 303 and transformed into a noisy signal spectrum $Y_n(k)$. The noisy signal spectrum $Y_n(k)$ is separated into a phase and magnitude. A noisy signal phase spectrum $\arg Y_n(k)$ is supplied to the phase control unit 202, and a noisy signal magnitude spectrum $|Y_n(k)|$ is supplied to the noise suppressor 205. As described above, the power spectrum can be used instead of the magnitude spectrum.

<<Arrangement of Inverse Transform Unit>>

Figure 4:
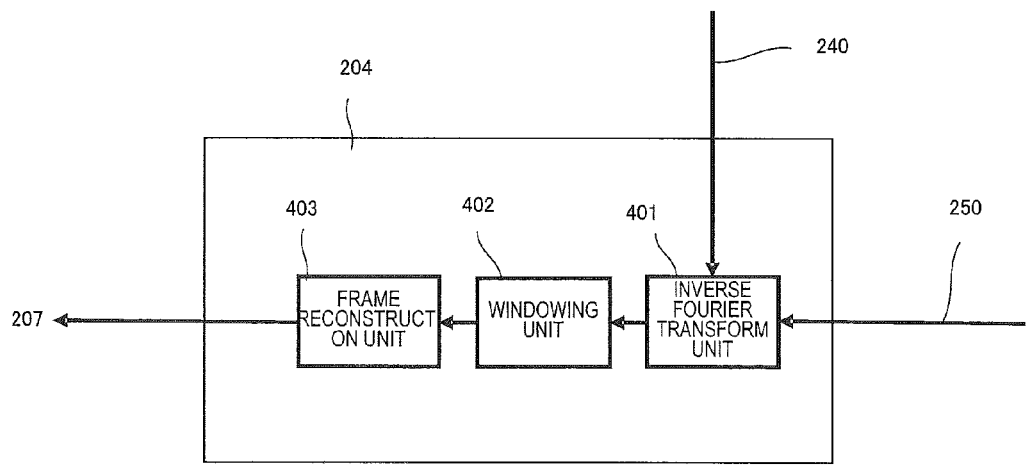
FIG. 4 is a block diagram showing the arrangement of an inverse transform unit according to the second embodiment of the present invention.

FIG. 4 is a block diagram showing the arrangement of the inverse transform unit 204. As shown in FIG. 4, the inverse transform unit 204 includes an inverse Fourier transform unit 401, windowing unit 402, and frame reconstruction unit 403. The inverse Fourier transform unit 401 obtains an enhanced signal (left-hand side of equation (4)) by multiplying an enhanced signal magnitude spectrum supplied from a magnitude control unit 203, and the enhanced signal phase spectrum $\arg Y_n(k)$ supplied from the phase control unit 202:

$$\overline{X}_n(k) = |\overline{X}_n(k)| \cdot \arg Y_n(k) \quad (4)$$

Inverse Fourier transform is performed for the obtained enhanced signal, and the resultant signal is supplied to the windowing unit 402 as a series $x_n(t)$ (t=0, 1, ..., K−1) of time domain samples in which one frame includes K samples. The windowing unit 402 multiplies the series of time domain samples by the window function w(t). A signal obtained by windowing the input signal $x_n(t)$ (t=0, 1, ..., K/2−1) of the nth frame is given by the left-hand side of equation (5):

$$\bar{x}_n(t) = w(t) x_n(t) \quad (5)$$

Two successive frames may be partially superimposed (overlap) and windowed. Assuming that the overlapping length is 50% of the frame length, the left-hand side of the following equation serves as an output from the windowing unit 402 for t=0, 1, ..., K/2−1, and transmitted to the frame reconstruction unit 403:

$$\left. \begin{array}{l} \bar{x}_n(t) = w(t) x_{n-1}(t + K/2) \\ \bar{x}_n(t + K/2) = w(t + K/2) x_n(t) \end{array} \right\} \quad (6)$$

The frame reconstruction unit 403 extracts outputs of two adjacent frames from the windowing unit 402 for every K/2 samples, superimposes them, and obtains an output signal (left-hand side of equation (7)) for t=0, 1, ..., K−1:

$$\hat{x}_n(t) = \bar{x}_{n-1}(t + K/2) + \bar{x}_n(t) \quad (7)$$

The frame reconstruction unit 403 transmits the obtained output signal to the output terminal 207.

In FIGS. 3 and 4, the transform processes in the transform unit and inverse transform unit have been described as Fourier transform processes. However, another transform such as Hadamard transform, Haar transform, or Wavelet transform is also usable, instead of Fourier transform. Haar transform obviates the need for multiplication, and can decrease the area on an LSI circuit. Wavelet transform can change the time resolution depending on the frequency, and provide better noise suppression.

It is also possible to actually suppress noise by the noise suppressor 205 after a plurality of frequency components obtained in the transform unit 201 are integrated. At this time, the sound quality can be improved by integrating a large number of frequency components from a low-frequency domain where the discrimination ability of auditory properties is high toward a high-frequency domain where it is poor. When noise suppression is executed after integrating a plurality of frequency components, the number of frequency components to which noise suppression is applied decreases, and the total amount of calculation can be reduced.

<<Arrangement of Noise Suppressor>>

The noise suppressor 205 estimates noise by using a noisy signal magnitude spectrum supplied from the transform unit 201, and generates an estimated noise spectrum. The noise suppressor 205 obtains a spectral gain by using the noisy signal magnitude spectrum supplied from the transform unit 201 and the generated estimated noise spectrum. The noise suppressor 205 multiplies the noisy signal magnitude spectrum by the spectral gain, and supplies the resultant spectrum as an enhanced signal magnitude spectrum to the magnitude control unit 203.

Noise estimation can employ various estimation methods, as described in M. Kato, A. Sugiyama, and M. Serizawa, "Noise suppression with high speech quality based on weighted noise estimation and MMSE STSA," IEICE Trans. Fundamentals (Japanese Edition), vol. J87-A, no. 7, pp. 851-860, July 2004. (literature 1), and R. Martin, "Spectral subtraction based on minimum statistics," EUSPICO-94, pp. 1182-1185, September 1994 (literature 2).

An example is a method (literature 1) in which the average value of the noisy signal magnitude spectra of frames in which no target sound is generated is used as an estimated noise spectrum. This method needs to detect generation of a target sound. A section in which the target sound is generated can be determined from the power of an enhanced signal.

As an ideal operation state, the enhanced signal is a target sound other than noise. The levels of the target sound and noise hardly change between adjacent frames. From this, the enhanced signal level of an immediately preceding frame is used as the index of noise section determination. When the enhanced signal power of an immediately preceding frame is equal to or lower than a predetermined value, the current frame is determined as a noise section. The noise spectrum can be estimated by averaging the noisy signal magnitude spectra of frames determined as noise sections.

There is also proposed a method (literature 1) in which an average value at the initial stage of estimation at which supply of a noisy signal magnitude spectrum starts is used as an estimated noise spectrum. In this case, a condition that no target sound is included immediately after the start of estimation needs to be satisfied. If this condition is satisfied, a noisy signal magnitude spectrum at the initial stage of estimation can be used as an estimated noise spectrum.

Further, there is a method (literature 2) in which the estimated noise spectrum is obtained from the statistically minimum value of a noisy signal magnitude spectrum. In this method, the statistically minimum value of a noisy signal magnitude spectrum in a predetermined time is held, and the noise spectrum is estimated from the minimum value. The minimum value of the noisy signal magnitude spectrum is similar to the spectral shape of the noise spectrum, and thus can be used as the estimated value of the noise spectral shape. However, the minimum value is smaller than an original noise level. For this reason, the minimum value is appropriately amplified and used as an estimated noise spectrum.

The noise suppressor 205 can perform various suppression processes. Typical examples are the SS (Spectrum Subtraction) method and the MMSE STSA (Minimum Mean-Square Error Short-Time Spectral Amplitude estimator). The SS method subtracts an estimated noise spectrum from a noisy signal magnitude spectrum supplied from the transform unit 201. The MMSE STSA method calculates a spectral gain by using the noisy signal magnitude spectrum supplied from the transform unit 201 and the generated estimated noise spectrum, and multiplies the noisy signal magnitude spectrum by the spectral gain. The spectral gain is decided to minimize the mean square power of the enhanced signal.

The noise suppressor 205 can perform various noise estimation processes. For example, there is a method in which the noisy signal magnitude spectrum of a frame in which no target sound is generated is used, and the average value is set as an estimated noise spectrum. There is also proposed a method in which an average value at the initial stage at which supply of a noisy signal magnitude spectrum has just started is used as an estimated noise spectrum.

Further, there is a method of observing the statistically minimum value of a noisy signal magnitude spectrum, and setting it as an estimated noise spectrum.

<<Arrangements of Phase Control Unit and Magnitude Control Unit>>

Figure 5:
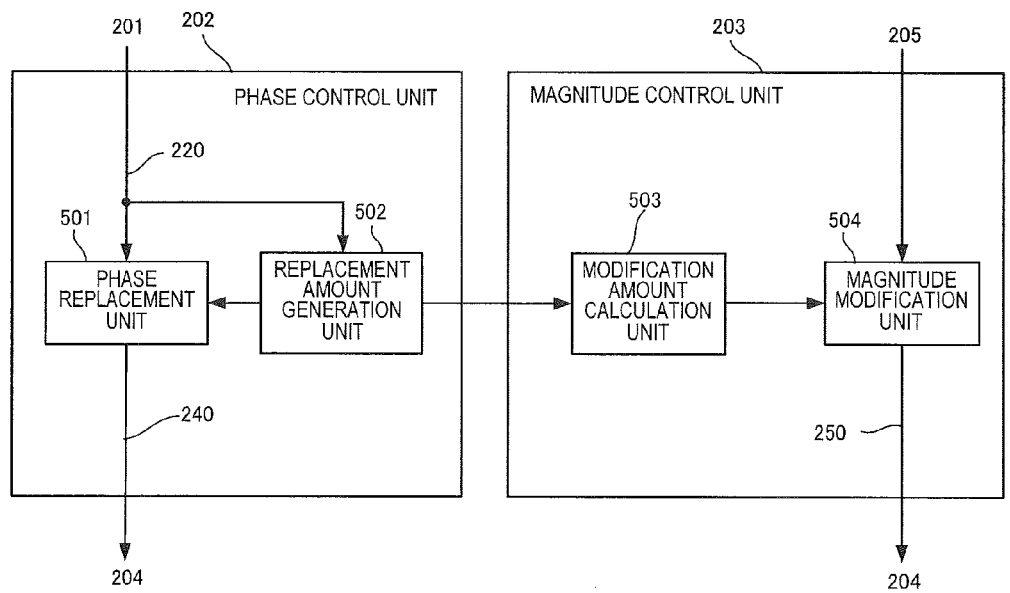
FIG. 5 is a block diagram showing the arrangement of a noise suppressor according to the second embodiment of the present invention.

FIG. 5 is a block diagram showing the arrangements of the phase control unit 202 and magnitude control unit 203. As shown in FIG. 5, the phase control unit 202 includes a phase replacement unit 501 and replacement amount generation unit 502. The magnitude control unit 203 includes a modification amount calculation unit 503 and magnitude modification unit 504.

The replacement amount generation unit 502 generates the replacement amount of a noisy signal phase spectrum, and supplies it to the phase replacement unit 501. Also, the replacement amount generation unit 502 obtains a rotation amount (shift amount) serving as a difference from the replacement amount generated upon receiving the noisy signal phase spectrum 220, and supplies it to the modification amount calculation unit 503. The phase replacement unit 501 receives the noisy signal phase spectrum 220 from the transform unit 201, and receives the replacement amount from the replacement amount generation unit 502. Then, the phase replacement unit 501 replaces the noisy signal phase spectrum 220 with the received replacement amount, and supplies the resultant spectrum as the enhanced signal phase spectrum 240 to the inverse transform unit 204. The modification amount calculation unit 503 decides a magnitude modification coefficient based on the rotation amount (shift amount) supplied from the replacement amount generation unit 502, and supplies it to the magnitude modification unit 504. The replacement amount generation unit 502 generates a replacement amount based on, for example, a random number. When the noisy signal phase spectrum is replaced at each frequency based on a random number, the shape of the noisy signal phase spectrum 220 changes. Changing the shape can weaken the feature of noise.

Examples of random numbers are uniform random numbers which are generated at a uniform probability, and normal random numbers having a probability of generation exhibiting a normal distribution. Here, a replacement amount generation method using uniform random numbers will be explained. The uniform random numbers can be generated by a linear congruential method or the like. The description will continue by exemplifying uniform random numbers generated by the linear congruential method. Uniform random numbers generated by the linear congruential method are uniformly distributed within the range of 0 to $(2^M)-1$, in which M is an arbitrary integer and ^ is exponentiation. Phase replacement amounts $\phi$ need to be distributed within the range of 0 to $2\pi$. To achieve this, generated uniform random numbers are transformed. The transform is performed in accordance with equation (8):

$$\phi = 2\pi \frac{R}{R_{max}} \quad (8)$$

where R is a uniform random number, and $R_{max}$ is a possible maximum value of the uniform random number. When uniform random numbers are generated by the linear congruential method, $R_{max}=(2^M)-1$.

To simplify the calculation, the R value can be directly used as the replacement amount. $2\pi$ of the replacement amount represents one rotation, that is, 0. Replacement of the phase with the current phase $\pm 2\pi$ equals no replacement.

Hence, the replacement amount $\pm 2\pi + \phi$ equals the replacement amount $\phi$. The case in which uniform random numbers are generated by the linear congruential method has been described. However, even when uniform random numbers are generated by another method, it suffices to obtain the replacement amount $\phi$ according to equation (8).

The phase replacement unit 501 receives the replacement amount from the replacement amount generation unit 502, and replaces the noisy signal phase spectrum. If the noisy signal phase spectrum is expressed by the angle, the angle is replaced with the value of the replacement amount $\phi$. When the noisy signal phase spectrum is expressed by a complex normal vector, the normal vector of the replacement amount $\phi$ is obtained to replace the noisy signal phase spectrum.

The normal vector of the replacement amount $\phi$ is obtained in accordance with equation (9):

$$\Phi = \cos(\phi) + j \sin(\phi) \tag{9}$$

where $\Phi$ is the replacement vector, j is sqrt(−1), and sqrt is the square root.

A modification coefficient calculation method by the modification amount calculation unit 503 will be explained. First, a drop of the output level by phase replacement will be explained with reference to FIGS. 6 and 7.

Figure 6:
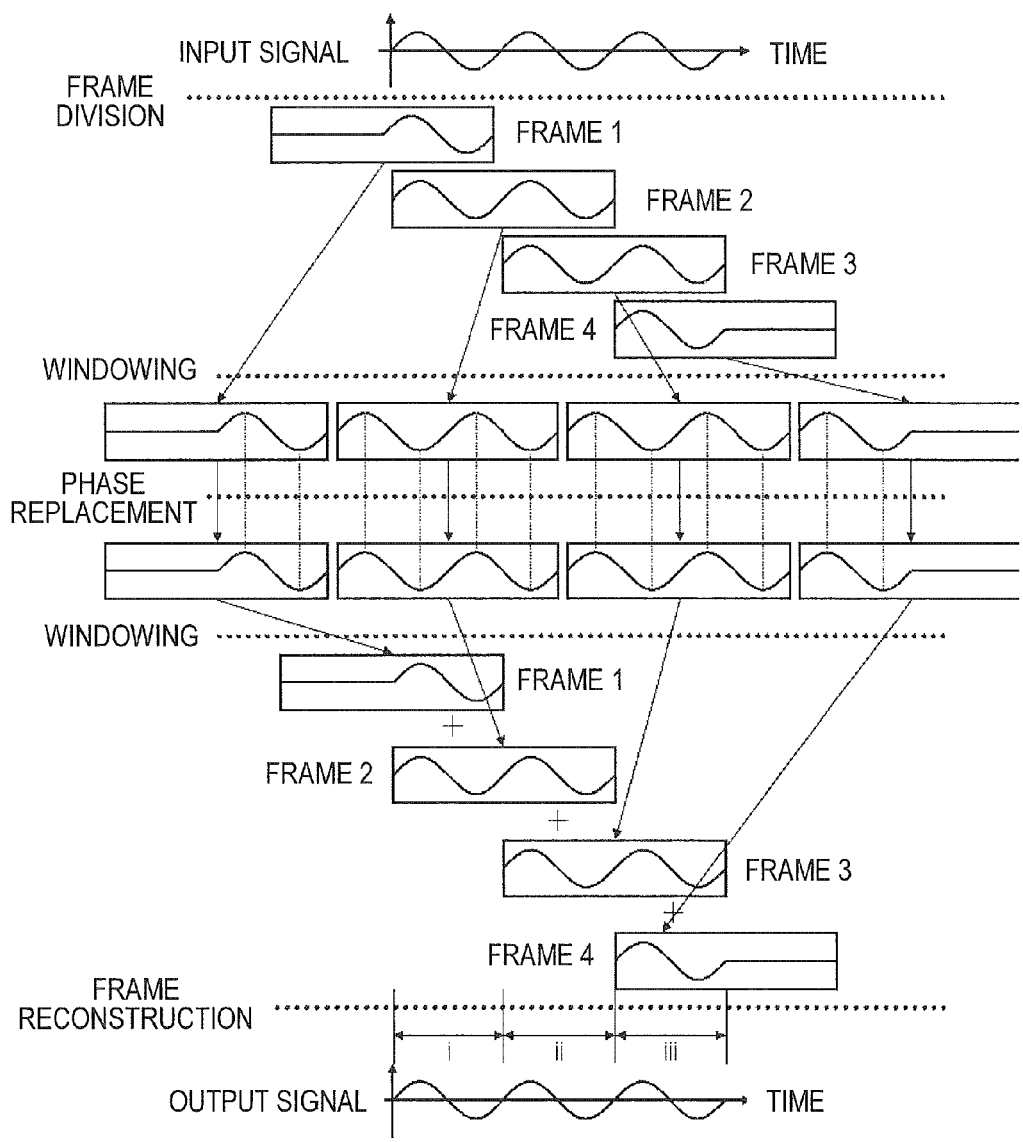
FIG. 6 is a view showing a signal flow when no phase replacement is performed in the frequency domain according to the second embodiment of the present invention.
Figure 7:
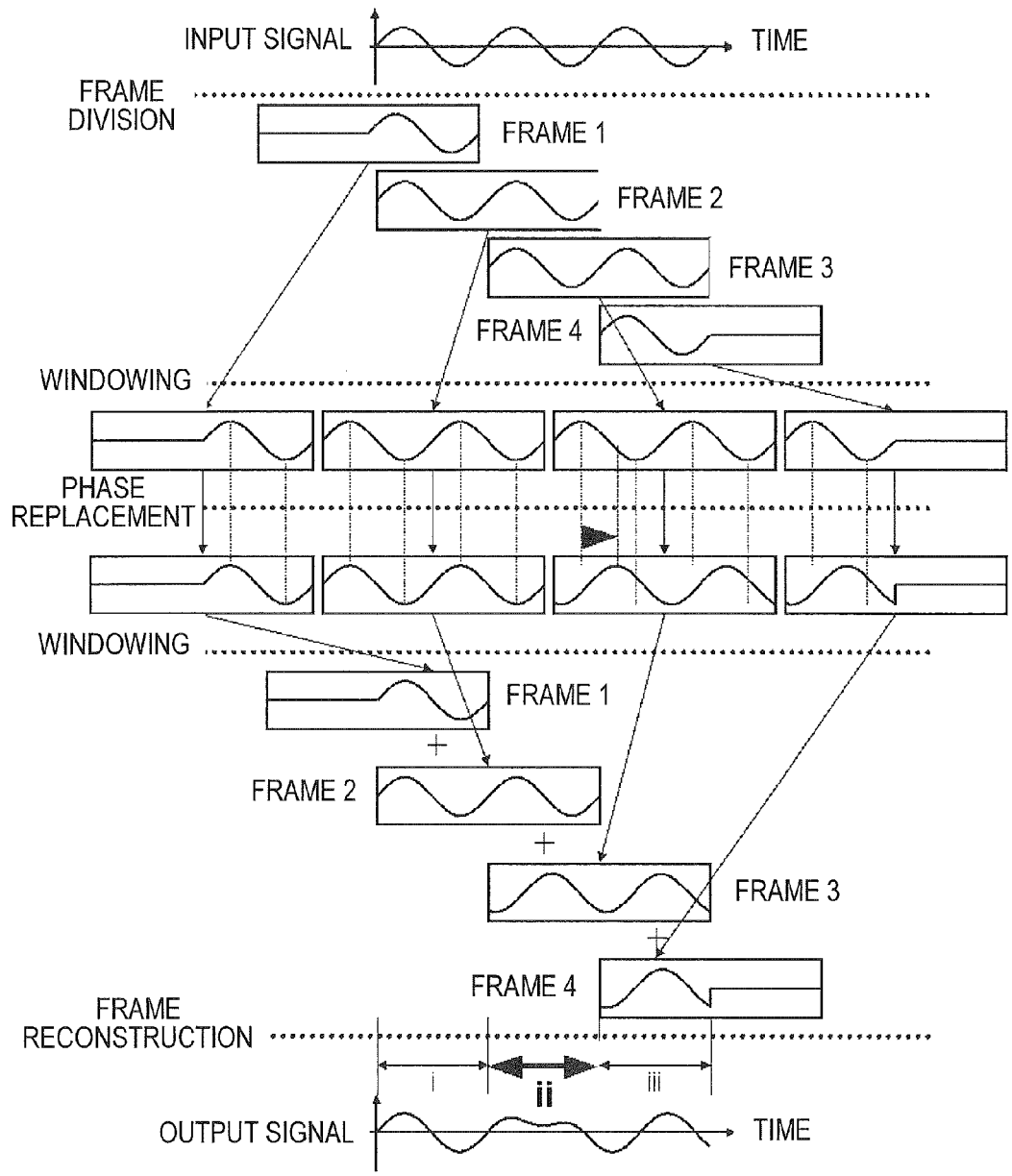
FIG. 7 is a view showing a signal flow when phase replacement is performed in the frequency domain according to the second embodiment of the present invention.

FIGS. 6 and 7 show signals when a noisy signal is processed by the arrangement shown in the block diagram of FIG. 2. A difference between FIGS. 6 and 7 is the presence/absence of phase replacement. FIG. 6 shows signals when no phase replacement is performed, and FIG. 7 shows signals when phase replacement is performed in frame 3.

Signals when no phase is replaced will be explained with reference to FIG. 6. A noisy signal is illustrated at the top of FIG. 6. The frame division unit 301 divides the noisy signal into frames. The second signal from the top, which is sectioned by a dotted line, is a signal after frame division. Signals of four successive frames are illustrated here. The frame overlapping ratio is 50%.

The windowing unit 302 performs windowing for the signals of the divided frames. The third signal from the top, which is sectioned by a dotted line, is a signal after windowing. In FIG. 6, weighting by a rectangular window is executed to clearly represent the influence of phase replacement.

After that, the Fourier transform unit 303 transforms a signal into one in the frequency domain. However, the signal in the frequency domain is not illustrated in FIG. 6. A lower part below the dotted line of phase replacement illustrates a signal transformed to the time domain by the inverse Fourier transform unit 401 of the inverse transform unit 204. The fourth signal from the top, which is sectioned by a dotted line, is a signal after phase replacement. However, no phase replacement is performed in FIG. 6, so the signal does not change from one after windowing.

Windowing is executed again for an enhanced signal output from the inverse Fourier transform unit 401 of the inverse transform unit 204. FIG. 6 shows a case in which weighting by a rectangular window is executed. The frame reconstruction unit 403 reconstructs windowed signals. At this time, the times between frames need to be adjusted. Since the frame overlapping ratio is 50%, frames overlap each other just by half. If no phase replacement is executed, the input signal and output signal coincide with each other, as shown in FIG. 6.

In contrast, signals when the phase is replaced will be explained with reference to FIG. 7. FIG. 7 shows signals when phase replacement is executed in frame 3. The same noisy signal as that in FIG. 6 is illustrated at the top of FIG. 7. Signals after frame division and windowing are also the same as those in FIG. 6.

FIG. 7 shows a case in which phase replacement is executed in frame 3. Attention is paid to a section indicated by a right-pointing triangle below the dotted line of the phase replacement process. The phase replacement process shifts signals of frames 3 and 4 in the time direction. The signal having undergone phase replacement is windowed again to perform frame reconstruction. At this time, signals of frames 2 and 3 differ from each other in section ii where frames 2 and 3 overlap each other. As a result, the output signal level after frame reconstruction becomes low in section ii. That is, when phase replacement is executed, the output signal level drops in section ii of FIG. 7.

The drop of the output signal level by phase replacement can also be explained by vector reconstruction in the frequency domain by replacing addition in the time domain with addition in the frequency domain.

Figure 8:
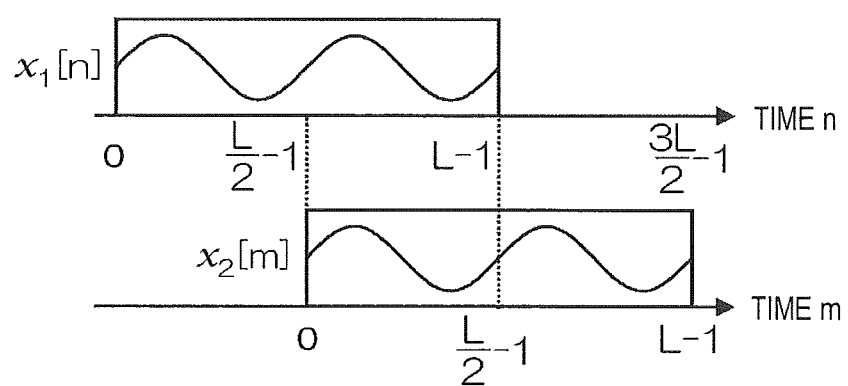
FIG. 8 is a chart showing overlapping addition of frames when no phase replacement is performed in the frequency domain according to the second embodiment of the present invention.

FIG. 8 shows noisy signals $x_1[n]$ and $x_2[m]$ of two successive frames after frame division and windowing. Note that the overlapping ratio is 50%. n is the discrete time of $x_1$, and m is the discrete time of $x_2$. When the overlapping ratio is 50%, equation (10) is established:

$$m = n + L/2 \tag{10}$$

The relationship between $x_1$ and $x_2$ is given by equation (11):

$$x_2[m] = x_1[n+L/2] \tag{11}$$

First, a transform equation from a time domain signal into a frequency domain signal, and an inverse transform equation will be described. A frequency domain signal X[k] is given by equation (12) based on Fourier transform of a time domain signal x[n]:

$$X[k] = \sum_{n=0}^{L-1} x[n] e^{-j2\pi \frac{n}{L} k} \tag{12}$$

where k is the discrete frequency, and L is the frame length. Inverse transform to return the frequency domain signal X[k] into the time domain signal x[n] is given by equation (13):

$$x[n] = \frac{1}{L} \sum_{k=0}^{L-1} X[k] e^{j2\pi \frac{n}{L} k} \tag{13}$$

Based on this, transform of the time domain signals $x_1[n]$ and $x_2[m]$ into the frequency domain signals $X_1[k]$ and $X_2[k]$ is given by equations (14) and (15):

$$X_1[k] = \sum_{n=0}^{L-1} x_1[n] e^{-j2\pi \frac{n}{L} k} \tag{14}$$

$$X_2[k] = \sum_{m=0}^{L-1} x_2[m] e^{-j2\pi \frac{m}{L} k} \tag{15}$$

Inverse transform to return the frequency domain signals $X_1[k]$ and $X_2[k]$ into the time domain signals $x_1[n]$ and $x_2[m]$, respectively, is given by equations (16) and (17) based on equation (13):

$$x_1[n] = \frac{1}{L}\sum_{k=0}^{L-1} X_1[k]e^{j2\pi\frac{n}{L}k} \quad (16)$$

$$x_2[m] = \frac{1}{L}\sum_{k=0}^{L-1} X_2[k]e^{j2\pi\frac{m}{L}k} \quad (17)$$

The inverse transform unit transforms a frequency domain signal into a time domain signal by Fourier transform. After that, the frame reconstruction unit performs overlap addition of enhanced sounds of preceding and current frames. For example, at the overlapping ratio of 50% in the illustrated example, adjacent frames are added in a section of the discrete time m=L/2 to L−1. The addition section m=L/2 to L−1 will be examined.

Substituting equations (16) and (17) into time domain addition is given by equation (18):

$$x_1[n] + x_2[m] = \frac{1}{L}\sum_{k=0}^{L-1} X_1[k]e^{j2\pi\frac{n}{L}k} + \frac{1}{L}\sum_{k=0}^{L-1} X_2[k]e^{j2\pi\frac{m}{L}k} \quad (18)$$

Further, substituting equations (14) and (15) into the frequency domain signals $X_1[k]$ and $X_2[k]$ in equation (18) is given by equation (19):

$$x_1[n] + x_2[m] = \frac{1}{L}\sum_{k=0}^{L-1} X_1[k]e^{j2\pi\frac{n}{L}k} + \frac{1}{L}\sum_{k=0}^{L-1} X_2[k]e^{j2\pi\frac{m}{L}k} = \\ \frac{1}{L}\sum_{k=0}^{L-1}\left(\sum_{n=0}^{L-1} x_1[n]e^{-j2\pi\frac{n}{L}k}\right)e^{j2\pi\frac{n}{L}k} + \\ \frac{1}{L}\sum_{k=0}^{L-1}\left(\sum_{m=0}^{L-1} x_2[m]e^{-j2\pi\frac{m}{L}k}\right)e^{j2\pi\frac{m}{L}k} \quad (19)$$

Equation (19) is expanded into equation (20):

$$x_1[n] + x_2[m] = \frac{1}{L}\sum_{k=0}^{L-1}\left(\sum_{n=0}^{L-1} x_1[n]e^{-j2\pi\frac{n}{L}k}\right)e^{j2\pi\frac{n}{L}k} + \\ \frac{1}{L}\sum_{k=0}^{L-1}\left(\sum_{m=0}^{L-1} x_2[m]e^{-j2\pi\frac{m}{L}k}\right)e^{j2\pi\frac{m}{L}k} = \\ \frac{1}{L}\sum_{k=0}^{L-1}\left(x_1[0]e^{-j2\pi\frac{0}{L}k} + x_1[1]e^{-j2\pi\frac{1}{L}k} + \ldots + x_1[L-1]e^{-j2\pi\frac{L-1}{L}k}\right)\\ e^{j2\pi\frac{n}{L}k} + \frac{1}{L}\sum_{k=0}^{L-1}\left(x_2[0]e^{-j2\pi\frac{0}{L}k} + x_2[1]e^{-j2\pi\frac{1}{L}k} + \\ \ldots + x_2[L-1]e^{-j2\pi\frac{L-1}{L}k}\right)e^{j2\pi\frac{m}{L}k} = \\ \frac{1}{L}\left\{x_1[0]\sum_{k=0}^{L-1} e^{j\frac{2\pi}{L}(n-0)k} + x_1[1]\sum_{k=0}^{L-1} e^{j\frac{2\pi}{L}(n-1)k} + \ldots + \\ x_1[L-1]\sum_{k=0}^{L-1} e^{j\frac{2\pi}{L}(n-L+1)k}\right\} + \quad (20)$$

$$\frac{1}{L}\left\{x_2[0]\sum_{k=0}^{L-1} e^{j\frac{2\pi}{L}(m-0)k} + x_2[1]\sum_{k=0}^{L-1} e^{j\frac{2\pi}{L}(m-1)k} + \\ \ldots + x_2[L-1]\sum_{k=0}^{L-1} e^{j\frac{2\pi}{L}(m-L+1)k}\right\}$$

Summation included in each term of equation (20) will be considered. By introducing an arbitrary integer g, equation (21) is established:

$$\sum_{k=0}^{L-1} e^{j\frac{2\pi}{L}gk} \quad (21)$$

An inverse Fourier transform of a delta function δ[g] is given by equation (22):

$$\delta[g] = \frac{1}{L}\sum_{k=0}^{L-1} e^{j\frac{2\pi}{L}gk} \quad (22)$$

The delta function δ[g] is given by equation (23):

$$\delta[g] = \begin{cases} 1 & g = 0 \\ 0 & g \neq 0 \end{cases} \quad (23)$$

From equation (22), equation (21) can be rewritten into equation (24):

$$\sum_{k=0}^{L-1} e^{j\frac{2\pi}{L}gk} = L \cdot \delta[g] \quad (24)$$

From the relation of equation (24), equation (20) can be rewritten into equation (25):

$$x_1[n] + x_2[m] = \quad (25)$$
$$\frac{1}{L}\{L \cdot x_1[0]\delta[0] + L \cdot x_1[1]\delta[n-1] + \ldots + L \cdot x_1[L-1]\delta[n-L+1]\} + \\ \frac{1}{L}\{L \cdot x_2[0]\delta[0] + L \cdot x_2[1]\delta[m-1] + \ldots + L \cdot x_2[L-1]\delta[m-L+1]\}$$

Hence, equation (20) is rewritten into equation (26):

$$x_1[n] + x_2[m] = \frac{1}{L}\{L \cdot x_1[n]\} + \frac{1}{L}\{L \cdot x_2[m]\} = x_1[n] \cdot x_2[m] \quad (26)$$

Figure 9:
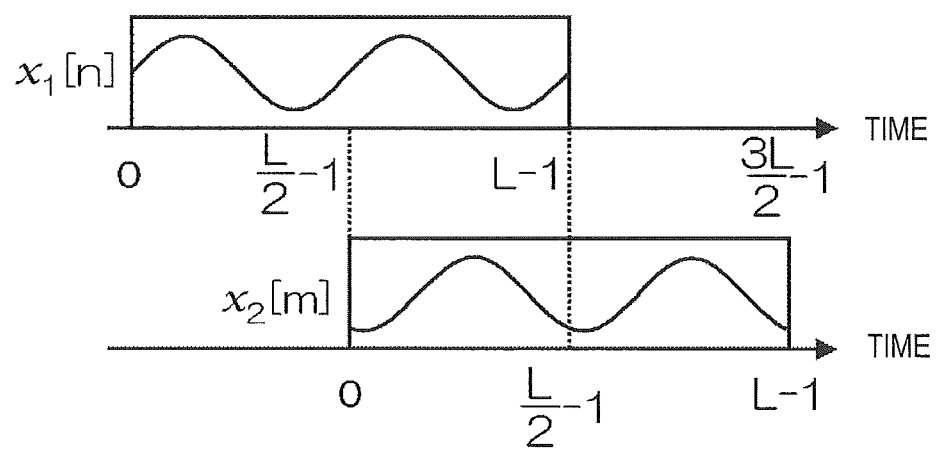
FIG. 9 is a chart showing overlapping addition of frames when phase replacement is performed in the frequency domain according to the second embodiment of the present invention.

A case in which phase replacement is performed for the frequency domain signal $X_2[k]$ will be considered. A time domain signal at this time is as shown in FIG. 9.

If replacement of the phase spectrum of $X_2[k]$ is equivalently regarded as rotation by φ[k], the inverse transform is given by equation (27):

$$x_2[m] = \frac{1}{L}\sum_{k=0}^{L-1} X_2[k]e^{j\phi[k]}e^{j2\pi\frac{m}{L}k} \quad (27)$$

Equation (27) is substituted into equation (18) to establish equation (28):

$$x_1[n] + x_2[m] = \frac{1}{L}\sum_{k=0}^{L-1} X_1[k]e^{j2\pi\frac{n}{L}k} + \frac{1}{L}\sum_{k=0}^{L-1} X_2[k]e^{j\phi[k]}e^{j2\pi\frac{m}{L}k} = \quad (28)$$

$$\frac{1}{L}\sum_{k=0}^{L-1}\left(\sum_{n=0}^{L-1} x_1[n]e^{-j2\pi\frac{n}{L}k}\right)e^{j2\pi\frac{n}{L}k} +$$

$$\frac{1}{L}\sum_{k=0}^{L-1}\left(\sum_{m=0}^{L-1} x_2[m]e^{-(j2\pi\frac{m}{L}k+\phi[k])}\right)e^{j2\pi\frac{m}{L}k}$$

Equation (28) is expanded to establish equation (29):

$$x_1[n] + x_2[m] = \frac{1}{L}\left\{x_1[0]\sum_{k=0}^{L-1} e^{j\frac{2\pi}{L}(n-0)k} + \right. \quad (29)$$

$$\left. x_1[1]\sum_{k=0}^{L-1} e^{j\frac{2\pi}{L}(n-1)k} + \ldots + x_1[L-1]\sum_{k=0}^{L-1} e^{j\frac{2\pi}{L}(n-L+1)k}\right\} +$$

$$\frac{1}{L}\left\{x_2[0]\sum_{k=0}^{L-1} e^{j\frac{2\pi}{L}(m-0)k}e^{j\phi[k]} + x_2[1]\sum_{k=0}^{L-1} e^{j\frac{2\pi}{L}(m-1)k}e^{j\phi[k]} + \right.$$

$$\left. \ldots + x_2[L-1]\sum_{k=0}^{L-1} e^{j\frac{2\pi}{L}(m-L+1)k}e^{j\phi[k]}\right\}$$

Assuming that the overlapping ratio is 50%, the overlapping section n=L/2 to L−1 will be examined. In the overlapping section, the equation can be expanded into equation (30) based on equation (11):

$$x_1\left[n+\frac{L}{2}\right] + x_2[m] = \quad (30)$$

$$\frac{1}{L}\left\{x_1\left[\frac{L}{2}\right]\sum_{k=0}^{L-1} e^{j\frac{2\pi}{L}(n+\frac{L}{2}-\frac{L}{2})k} + x_1\left[\frac{L}{2}+1\right]\sum_{k=0}^{L-1} e^{j\frac{2\pi}{L}(n+\frac{L}{2}-1-\frac{L}{2}+1)k} + \right.$$

$$\left. \ldots + x_1[L-1]\sum_{k=0}^{L-1} e^{j\frac{2\pi}{L}(n+\frac{L}{2}-L+1-L+1)k}\right\} +$$

$$\frac{1}{L}\left\{x_2[0]\sum_{k=0}^{L-1} e^{j\frac{2\pi}{L}(n-0)k}e^{j\phi[k]} + x_2[1]\sum_{k=0}^{L-1} e^{j\frac{2\pi}{L}(n-1)k}e^{j\phi[k]} + \right.$$

$$\left. \ldots + x_2\left[L-\frac{L}{2}-1\right]\sum_{k=0}^{L-1} e^{j\frac{2\pi}{L}(n-\frac{L}{2}-L+1)k}e^{j\phi[k]}\right\} =$$

$$\frac{1}{L}\left\{x_2[0]\sum_{k=0}^{L-1} e^{j\frac{2\pi}{L}nk} + x_2[1]\sum_{k=0}^{L-1} e^{j\frac{2\pi}{L}nk} + \ldots + \right.$$

$$\left. x_2\left[L-\frac{L}{2}-1\right]\sum_{k=0}^{L-1} e^{j\frac{2\pi}{L}nk}\right\} +$$

$$\frac{1}{L}\left\{x_2[0]\sum_{k=0}^{L-1} e^{j\frac{2\pi}{L}(n-0)k}e^{j\phi[k]} + x_2[1]\sum_{k=0}^{L-1} e^{j\frac{2\pi}{L}(n-1)k}e^{j\phi[k]} + \right.$$

-continued $$\left. \ldots + x_2\left[L-\frac{L}{2}-1\right]\sum_{k=0}^{L-1} e^{j\frac{2\pi}{L}(n-\frac{L}{2}-L+1)k}e^{j\phi[k]}\right\} =$$

$$\frac{1}{L}\left\{x_2[0]\sum_{k=0}^{L-1} e^{j\frac{2\pi}{L}nk}(1+e^{j\phi[k]}) + x_2[1]\sum_{k=0}^{L-1} e^{j\frac{2\pi}{L}(n-1)k}(1+e^{j\phi[k]}) + \right.$$

$$\left. \ldots + x_2\left[\frac{L}{2}-1\right]\sum_{k=0}^{L-1} e^{j\frac{2\pi}{L}(n-\frac{L}{2}-1)k}(1+e^{j\phi[k]})\right\}$$

Figure 10:
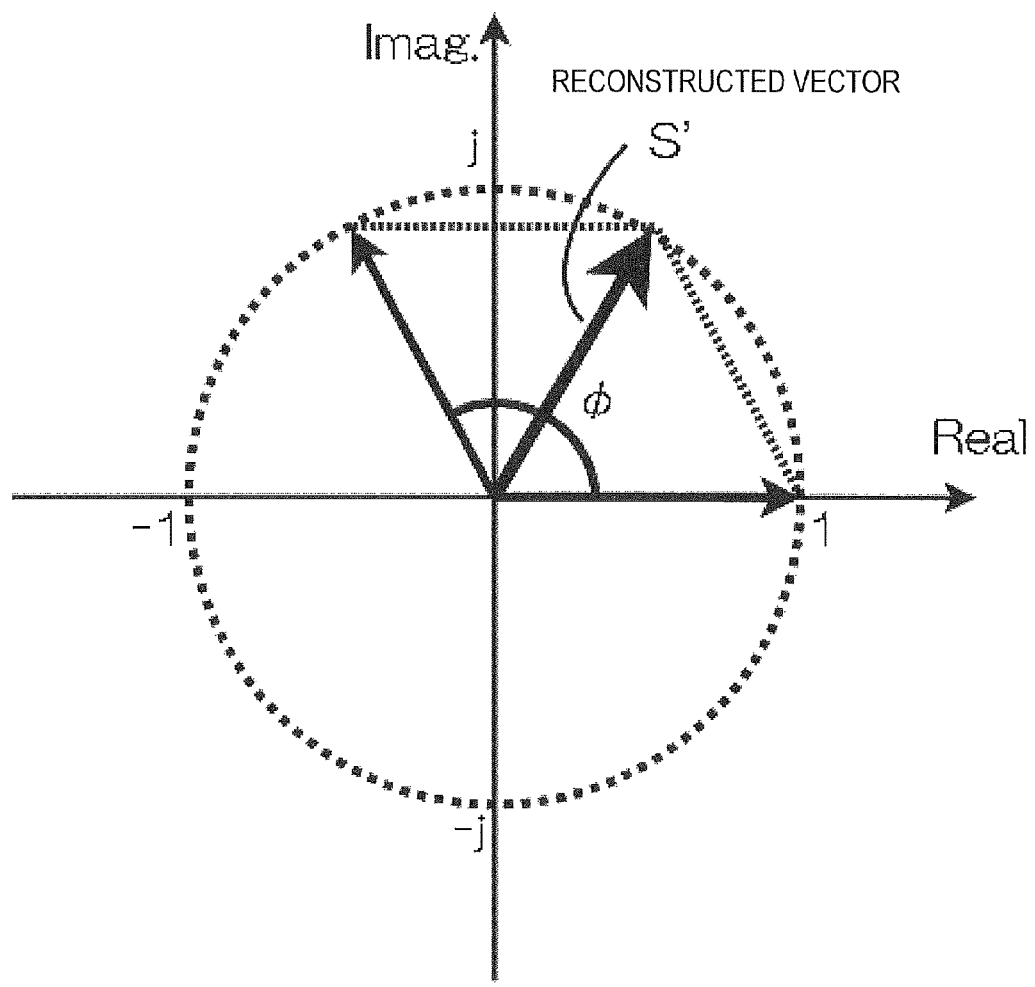
FIG. 10 is a view showing the vector of a frequency domain signal when phase replacement is performed in the frequency domain according to the second embodiment of the present invention.
Figure 11:
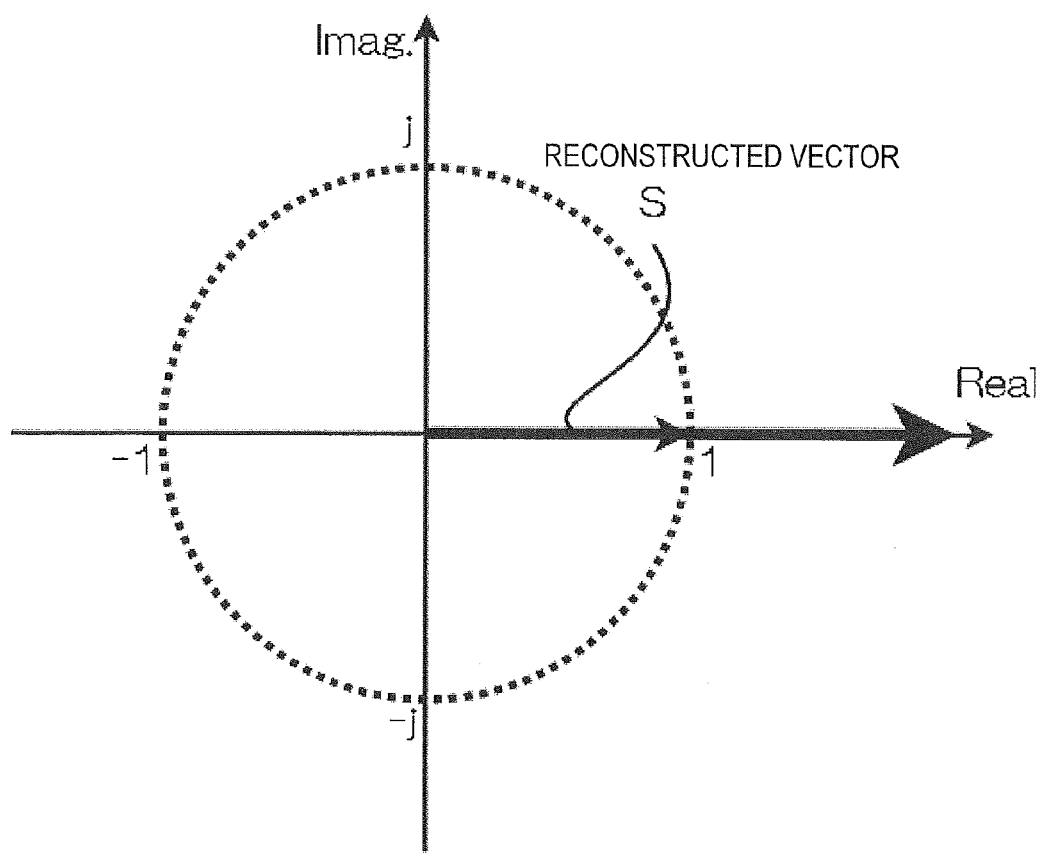
FIG. 11 is a view showing the vector of a frequency domain signal when no phase replacement is performed in the frequency domain according to the second embodiment of the present invention.

In this case, the parenthesized term:

$$1 + e^{j\phi[k]} \quad (31)$$

in each term is vector reconstruction. When attention is paid to a specific frequency k, the frequency domain signal can be represented as shown in FIG. 10. When no phase replacement is performed, that is, φ[k]=0, a frequency domain signal as shown in FIG. 11 is obtained.

The absolute value of expression (31) is given by equation (32):

$$|1 + e^{j\phi[k]}| = |1 + \cos\phi[k] + j\sin\phi[k]| = \sqrt{(1+\cos\phi[k])^2 + \sin^2\phi[k]} = \quad (32)$$

$$\sqrt{1 + 2\cos\phi[k] + \cos^2\phi[k] + \sin^2\phi[k]} = \sqrt{2(1+\cos\phi[k])}$$

A condition to maximize the absolute value of expression (31) is φ[k]=0, and its value is 2. That is, executing phase replacement decreases the magnitude of an output signal.

To modify the drop of the output signal level, the modification amount calculation unit 503 decides the magnitude modification amount of the enhanced signal magnitude spectrum.

A modification amount calculation method will be explained in detail on the assumption that the phase replacement amount is decided by a uniform random number. To simplify a problem, attention is paid to variations of the magnitude caused by phase replacement, and respective frequency components are assumed to have been normalized to unit vectors.

First, a case in which no phase replacement is performed will be considered. A reconstructed vector when the phase is the same between successive frames is represented by S shown in FIG. 11. The magnitude |S| of this vector is given by equation (33):

$$|S| = \sqrt{\{1+1\}^2} \quad (33)$$

$$= \sqrt{2^2}$$

$$= 2$$

In contrast, when phase replacement is performed by a uniform random number, phase differences φ between successive frames are uniformly distributed within the range of −π to +π. A reconstructed vector when the phase differs between successive frames is a vector S' shown in FIG. 10. The magnitude |S'| of this vector is given by equation (34):

$$|S'| = \sqrt{\{1+\cos\phi\}^2 + \{\sin\phi\}^2} \quad (34)$$

$$= \sqrt{2 + 2\{\cos\phi\}}$$

An expected value $E(|S'|^2)$ is obtained in accordance with equation (35):

$$E(|S'|^2) = E(2 + 2\cos\phi) = E(2) + E(2\cos\phi) \quad (35)$$

Since $\phi$ are uniformly distributed from $-\pi$ to $+\pi$, equation (36) is obtained:

$$E(2\cos(\phi)) = 0 \quad (36)$$

Thus, the expected value of $|S'|^2$ is given by equation (37):

$$E(|S'|^2) = 2 \quad (37)$$

The expected value $E(|S'|^2)$ when no phase replacement is performed is given by equation (38) based on equation (33):

$$E(|S|^2) = E(2^2) \quad (38)$$
$$= E(4)$$
$$= 4$$

When the ratio of equation (37) to equation (38) is calculated, equation (39) is established:

$$E(|S'|^2)/E(|S|^2) = 2/4 \quad (39)$$
$$= 1/2$$

That is, when the phase is replaced using a uniform random number, the average value of the power of an output signal becomes ½ of an input. When modifying a magnitude value by the magnitude modification unit 504, the modification amount calculation unit 503 sets sqrt(2) as the modification coefficient, and transmits it to the magnitude modification unit 504. When modifying power, the modification amount calculation unit 503 sets "2" as the modification coefficient, and transmits it to the magnitude modification unit 504.

A case in which the replacement amount is generated using a uniform random number has been exemplified. However, the modification coefficient can be uniquely determined using even a normal random number or the like as long as the variance and average value are determined. Derivation of a modification coefficient in the use of a normal random number will be explained.

In replacement using a normal random number, the probability of generation of the rotation amount $\phi$ is decided based on a normal distribution. To obtain a power expected value when phase replacement is executed using a normal random number, weighting needs to be performed based on the probability of generation of $\phi$.

More specifically, a weighting function $f(\phi)$ based on the probability of generation of $\phi$ is introduced. The weighting function $f(\phi)$ weights $\cos(\phi)$. Further, normalization using the integral value of the weighting function $f(\phi)$ can provide a power expected value.

An output power expected value $E(S''^2)$ when phase replacement is performed using a normal random number can be given by equation (40) by introducing the weighting function $f(\phi)$ and its integral value into equation (35) which expresses an output power expected value based on a uniform random number:

$$E(|S''^2|) = E(2) + E\left(\frac{f(\phi)}{\int_{-\pi}^{\pi} f(\phi)d\phi} \cos(\phi)\right) \quad (40)$$

The weighting function $f(\phi)$ can be expressed by a normal distribution, so equation (41) is established:

$$f(\phi) = \frac{1}{\sqrt{2\pi}\sigma} \exp\left(-\frac{(\phi-\mu)^2}{2\sigma^2}\right) \quad (41)$$

where $\sigma$ is the variance, and $\mu$ is the average.

For example, for a standardized normal distribution having the average $\mu=0$ and the variance $\sigma=1$, the weighting function $f(\phi)$ is given by equation (42):

$$f(\phi) = \frac{1}{\sqrt{2\pi}} \exp\left(-\frac{\phi^2}{2}\right) \quad (42)$$

Substituting equation (42) into equation (40) yields equation (43):

$$E(|S''^2|) = E(2) + E\left(\frac{\exp\left(-\frac{\phi^2}{2}\right)}{\int_{-\pi}^{\pi} \exp\left(-\frac{\phi^2}{2}\right)d\phi} \cos(\phi)\right) \quad (43)$$

Then, the second term on the right-hand side of equation (43) is numerically calculated. Since equation (44) is established, the ratio to $E(|S^2|)$ when no phase replacement is performed is given by equation (45):

$$E(|S''|^2) = 2\{1+0.609\} = 3.218 \quad (44)$$

$$E(|S''|^2)/E(|S|^2) = 3218/4 = 0.805 \quad (45)$$

when replacing the phase with a normal random number of the standardized normal distribution, and modifying a magnitude value by the magnitude modification unit 504, the modification amount calculation unit 503 sets sqrt(1/0.805) as the modification coefficient, and transmits it. When modifying power, the modification amount calculation unit 503 sets "1/0.805" as the modification coefficient, and transmits it to the magnitude modification unit 504. Phase replacement may be performed for all or some frequencies. Magnitude modification is performed for only frequencies having undergone phase replacement. Hence, a modification coefficient for frequencies not to undergo phase replacement is set to 1.0. Only a modification coefficient for frequencies having undergone phase replacement is a value derived here.

<<Description of Magnitude Modification Unit>>

The magnitude control unit 203 calculates a magnitude modification coefficient by using a phase rotation amount transmitted from the phase control unit 202, multiplies an enhanced signal magnitude spectrum supplied from the noise suppressor 205 by the magnitude modification coefficient, and supplies it to the inverse transform unit 204. By this process, the noisy signal phase spectrum can be replaced, canceling a drop of the output level when the enhanced signal magnitude spectrum is obtained. As described above, according to the second embodiment, the magnitude control unit 203 can remove the influence of replacement of a phase spectrum on the output signal level, and a high-quality enhanced signal can be obtained.

Third Embodiment

The third embodiment of the present invention will be explained with reference to FIG. 12. The third embodiment is different from the second embodiment in that the upper limit of the amount of rotation caused by phase replacement is restricted. The remaining arrangement and operation are the same as those in the second embodiment, and a detailed description thereof will not be repeated.

Figure 12:
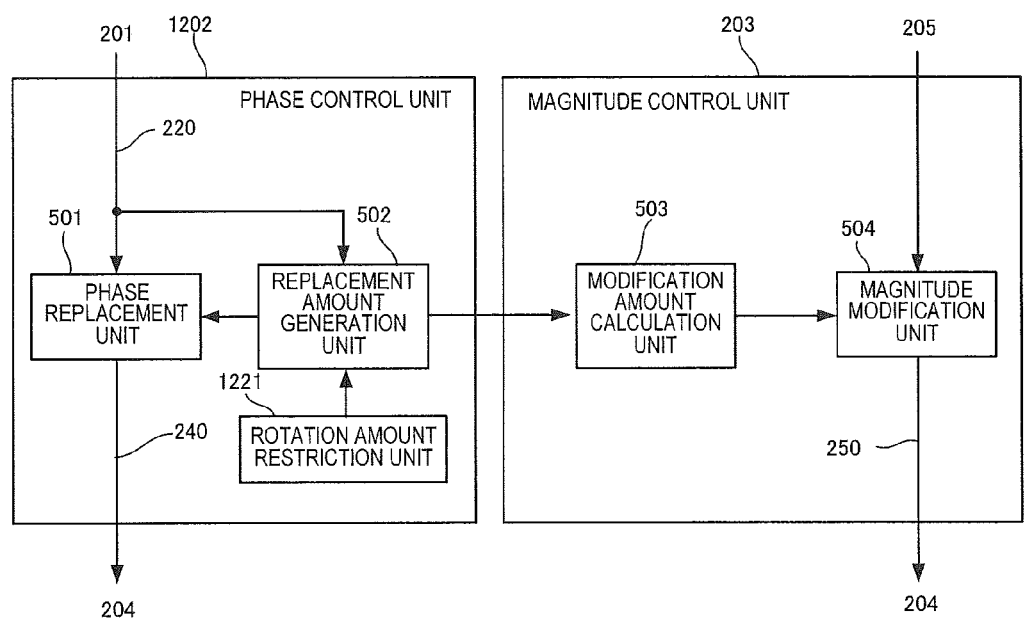
FIG. 12 is a block diagram showing the arrangements of a phase control unit and magnitude control unit according to the third embodiment of the present invention.

FIG. 12 is a block diagram showing the arrangements of a phase control unit 1202 and magnitude control unit 203 according to the third embodiment. As shown in FIG. 12, the phase control unit 1202 in the third embodiment includes a rotation amount restriction unit 1221, in addition to a replacement amount generation unit 502 and phase replacement unit 501 described in the second embodiment. The replacement amount generation unit 502 generates the replacement amount of a noisy signal phase spectrum under the restriction by the rotation amount restriction unit 1221, and supplies it to the phase replacement unit 501.

The rotation amount restriction unit 1221 restricts, within a predetermined range, the amount of rotation from a phase before replacement that arises from replacement by a replacement amount generated by the replacement amount generation unit 502. More specifically, the distribution of $\phi$ is restricted within an arbitrary range from 0 to $2\pi$. For example, the distribution of $\phi$ is restricted to 0 to $\pi/2$. As a result, the feature of the noisy signal phase spectrum remains to a certain degree in the enhanced signal phase spectrum. The feature of the noisy signal is held to some degree, and thus the influence on a target sound can be weakened to reduce the distortion of the target sound, compared to completely replacing the phase at random.

According to the third embodiment, in addition to the effects of the second embodiment, deterioration of a target sound can be reduced by restricting the amount of rotation caused by phase replacement.

Fourth Embodiment

The fourth embodiment of the present invention will be explained with reference to FIG. 13. The fourth embodiment is different from the second embodiment in that the phase component is delayed to obtain a phase component difference between frames, and then the modification amount is calculated from the difference. That is, the fourth embodiment is different from the second embodiment in the internal arrangements of a phase control unit 1302 and magnitude control unit 1303. The remaining arrangement and operation are the same as those in the second embodiment, and a description thereof will not be repeated.

Figure 13:
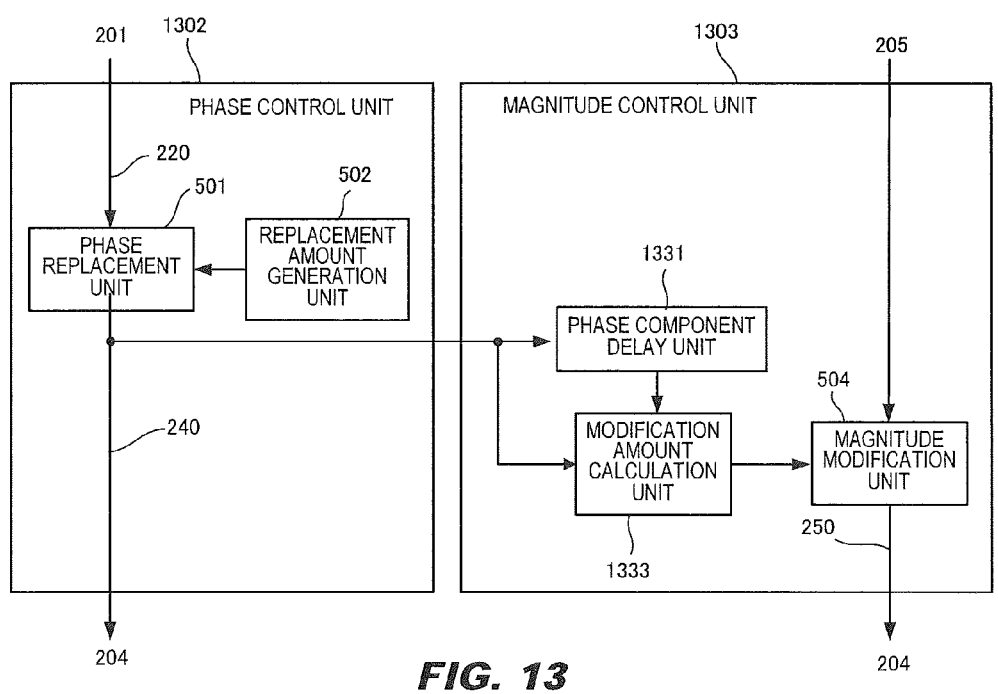
FIG. 13 is a block diagram showing the arrangements of a phase control unit and magnitude control unit according to the fourth embodiment of the present invention.

FIG. 13 is a block diagram showing the arrangements of the phase control unit 1302 and magnitude control unit 1303 according to the fourth embodiment. As shown in FIG. 13, the phase control unit 1302 in the fourth embodiment includes a replacement amount generation unit 502 and phase replacement unit 501 included in the second embodiment. Further, the phase control unit 1302 supplies a phase after replacement to the magnitude control unit 1303. The magnitude control unit 1303 includes a phase component delay unit 1331 and modification amount calculation unit 1333.

The phase component delay unit 1331 holds an enhanced signal phase spectrum supplied from the phase replacement unit 501 for one frame, and supplies it to the modification amount calculation unit 1333. The modification amount calculation unit 1333 calculates a magnitude modification amount from the enhanced signal phase spectrum of an immediately preceding frame supplied from the phase component delay unit 1331, and the current enhanced signal phase spectrum supplied from the phase replacement unit 501. Then, the modification amount calculation unit 1333 transmits the magnitude modification amount to a magnitude modification unit 504. The phase component delay unit 1331 is implemented by a simple 1-frame delay.

According to the fourth embodiment, in addition to the effects of the second embodiment, even when no output level expected value can be mathematically derived in correspondence with the phase replacement amount, the output level can be modified. For example, the probability of random number generation based on a random number table is nonuniform, but the fourth embodiment can modify the output level without any problem.

A modification amount calculation unit 503 obtains the magnitude of a reconstructed vector at each frequency from the enhanced signal phase spectra of preceding and current frames, and decides a modification coefficient based on the magnitude. Letting α be the phase of a preceding frame and β be the phase of a current frame, the magnitude |S'| of the reconstructed vector is given by equation (46):

$$|S'| = \sqrt{\{\cos\alpha + \cos\beta\}^2 + \{\sin\alpha + \sin\beta\}^2} \qquad (46)$$
$$= \sqrt{2 + 2\{\sin\alpha\sin\beta\} + 2\{\cos\alpha\cos\beta\}}$$

The magnitude |S| of a reconstructed vector when the phases of successive frames coincide with each other is |S|=2, which has already been derived by equation (33). Hence, the magnitude modification amount is given by equation (47):

$$|S|/|S'|=2/\sqrt{2+2\{\sin\alpha\sin\beta\}+2\{\cos\alpha\cos\beta\}} \qquad (47)$$

This value is supplied to the magnitude control unit 1303 to modify the enhanced signal magnitude spectrum, thereby canceling a drop of the output level. In the fourth embodiment, the arrangement and operation except for the magnitude control unit are the same as those in the second embodiment, and a description thereof will not be repeated.

Fifth Embodiment

Figure 14:
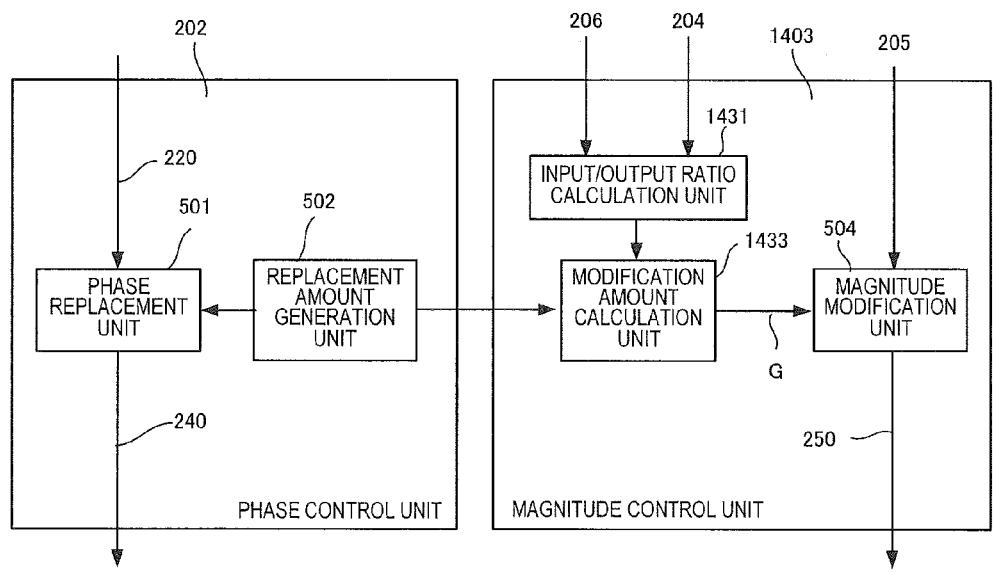
FIG. 14 is a block diagram showing the arrangements of a phase control unit and magnitude control unit according to the fifth embodiment of the present invention.

The fifth embodiment of the present invention will be explained with reference to FIG. 14. FIG. 14 is a block diagram showing the arrangements of a phase control unit 202 and magnitude control unit 1403 according to the fifth embodiment.

In the fifth embodiment, unlike the second embodiment, an input/output ratio calculation unit 1431 is introduced to receive a noisy signal from an input terminal 206 and an enhanced signal from an inverse transform unit 204, and calculate an input/output level ratio. The input/output level ratio is supplied to a modification amount calculation unit 1433. A magnitude modification unit 504 modifies an enhanced signal magnitude spectrum so that the level of the enhanced signal becomes equal to that of the noisy signal.

The input/output ratio calculation unit 1431 obtains the level ratio from the time domain signals of the noisy signal and enhanced signal.

A level ratio R of an enhanced signal $x_n(t)$ of the nth frame to a noisy signal $y_n(t)$ of the nth frame is given by equation (48):

$$R = \sum_{t=0}^{L-1} x_n(t) \bigg/ \sum_{t=0}^{L-1} y_n(t) \quad (48)$$

where t is the sample time, and L is the frame length of Fourier transform.

The modification amount calculation unit 1433 obtains a magnitude modification amount G from the ratio value R and the number of frequency components having undergone phase replacement. When the transform unit divides a time domain signal into N frequency components and phase replacement is performed for M phase spectra, the magnitude modification amount G is given by equation (49):

$$G = \frac{M}{N(R-1) + M} \quad (49)$$

The magnitude control unit 1403 executes magnitude modification for only frequencies having undergone phase replacement based on phase replacement presence/absence information transmitted from the phase control unit 202. In the fifth embodiment, the arrangement and operation except for the input/output ratio calculation unit 1431 and modification amount calculation unit 1433 are the same as those in the second embodiment, and a description thereof will not be repeated.

According to the fifth embodiment, the modification coefficient is obtained from a time domain signal, so the output level can be modified regardless of a phase replacement amount decision method.

Sixth Embodiment

Figure 15:
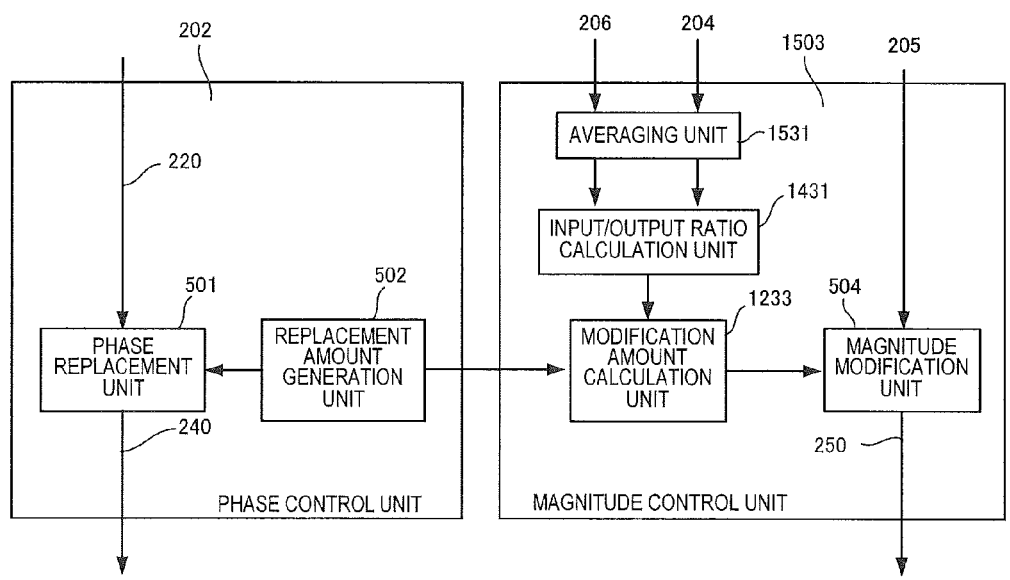
FIG. 15 is a block diagram showing the arrangements of a phase control unit and magnitude control unit according to the sixth embodiment of the present invention.

The sixth embodiment of the present invention will be explained with reference to FIG. 15. FIG. 15 is a block diagram showing the arrangements of a phase control unit 202 and magnitude control unit 1503 according to the sixth embodiment. As shown in FIG. 15, the magnitude control unit 1503 in the sixth embodiment includes an averaging unit 1531, in addition to an input/output ratio calculation unit 1431 included in the fifth embodiment. The arrangement and operation except for the averaging unit are the same as those in the fifth embodiment, and a description thereof will not be repeated.

The averaging unit 1531 receives a noisy signal from an input terminal 206, performs an averaging process, and then supplies the average value to the input/output ratio calculation unit 1431. The averaging unit 1531 receives an enhanced signal from an inverse transform unit 204, performs an averaging process, and then supplies the average value to the input/output ratio calculation unit 1431. The input/output ratio calculation unit 1431 receives the average values of the noisy signal and enhanced signal from the averaging unit 1531, and calculates the level ratio.

The averaging unit 1531 averages the levels of the noisy signal and enhanced signal at an arbitrary time length. More specifically, a moving average, leakage integral, or the like is used.

According to the sixth embodiment, in addition to the effects of the fifth embodiment, since an averaged level is used, variations of the modification amount can be suppressed to improve the quality of an output signal.

Seventh Embodiment

Figure 16:
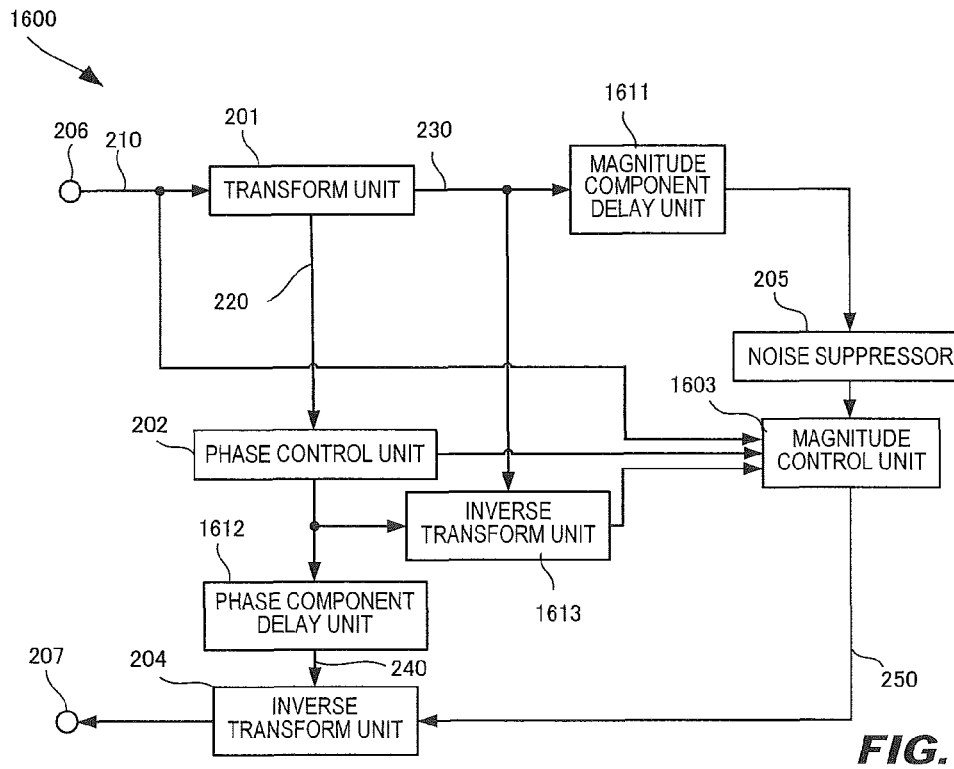
FIG. 16 is a block diagram showing the schematic arrangement of a noise suppression apparatus according to the seventh embodiment of the present invention.

The seventh embodiment of the present invention will be described with reference to FIGS. 16 and 17. FIG. 16 is a block diagram showing the arrangement of a noise suppression apparatus 1600 according to the seventh embodiment. In the seventh embodiment, unlike FIG. 2 of the second embodiment, a magnitude component delay unit 1611, phase component delay unit 1612, and inverse transform unit 1613 are added. The seventh embodiment is also different from the second embodiment in the internal arrangement of a magnitude control unit 1603. In the seventh embodiment, however, the operation except for the magnitude component delay unit, phase component delay unit, and magnitude control unit is the same as that in the sixth embodiment, and a description thereof will not be repeated.

A noisy signal supplied to an input terminal 206 is supplied to a transform unit 201 and the magnitude control unit 1603. A noisy signal magnitude spectrum 230 output from the transform unit 201 is supplied to the magnitude component delay unit 1611 and inverse transform unit 1613. A noisy signal phase spectrum 220 is supplied to a phase control unit 202. The phase control unit 202 replaces the noisy signal phase spectrum 220 supplied from the transform unit 201, and supplies it as an enhanced signal phase spectrum to the inverse transform unit 1613 and phase component delay unit 1612. Also, the phase control unit 202 transmits the presence/absence of phase replacement at each frequency to the magnitude control unit 1603.

By using the noisy signal magnitude spectrum 230 supplied from the transform unit 201 and the noisy signal phase spectrum supplied from the phase control unit 202, the inverse transform unit 1613 transmits, to the magnitude control unit 1603, a signal whose level has dropped due to phase replacement.

The magnitude component delay unit 1611 delays the noisy signal magnitude spectrum 230 supplied from the transform unit 201, and supplies it to a noise suppressor 205.

The phase component delay unit 1612 delays the enhanced signal phase spectrum supplied from the phase control unit 202, and supplies it to an inverse transform unit 204. The noise suppressor 205 estimates noise by using the noisy signal magnitude spectrum supplied from the magnitude component delay unit 1611, and generates an estimated noise spectrum.

The inverse transform unit 204 performs inverse transform by reconstructing the enhanced signal phase spectrum 240 supplied from the phase control unit 202 via the phase component delay unit 1612 and a modified magnitude spectrum 250 supplied from the magnitude control unit 1603, and supplies the resultant signal as an enhanced signal to an output terminal 207.

The phase control unit 202 controls the noisy signal phase spectrum 220, and the inverse transform unit 1613 transforms it into a time domain signal. By using this signal and a noisy signal 210, the amount of level variations caused by phase replacement is obtained.

Since the variation amount arises from variations caused by only a replacement process by a phase replacement unit 501, level variations by phase replacement can be accurately grasped. Although magnitude modification is executed using the level ratio, the obtained level ratio is one for an immediately preceding frame.

Thus, the magnitude component delay unit 1611 and phase component delay unit 1612 are introduced, and the magnitude control unit 1603 performs magnitude modification for the frequency component of an immediately preceding frame.

Figure 17:
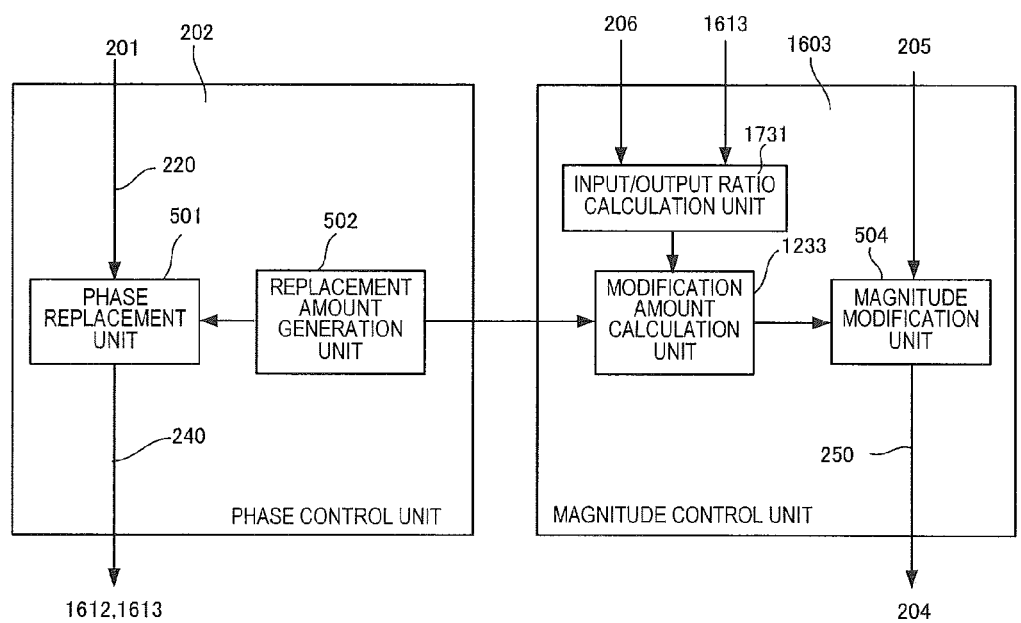
FIG. 17 is a block diagram showing the arrangements of a phase control unit and magnitude control unit according to the seventh embodiment of the present invention.

FIG. 17 is a block diagram for explaining the internal arrangements of the phase control unit 202 and magnitude control unit 1603 according to the seventh embodiment. An input/output ratio calculation unit 1731 calculates a level ratio from a noisy signal supplied from the input terminal 206 and a signal which is supplied from the inverse transform unit 1613 and contains a level drop caused by phase replacement. Then, the input/output ratio calculation unit 1731 supplies the level ratio to a modification amount calculation unit 1233.

The modification amount calculation unit 1233 receives phase replacement presence/absence information at each frequency from the phase control unit 202, and calculates a magnitude modification amount. A magnitude modification unit 504 modifies the enhanced signal phase spectrum at each frequency based on the magnitude modification amount, and supplies it to the inverse transform unit 204. The magnitude component delay unit 1611 may be interposed between the noise suppressor 205 and the magnitude control unit 1603.

According to the seventh embodiment, in addition to the effects of the fifth embodiment, a delay of the input/output ratio that is inevitable in the fifth and sixth embodiments can be avoided, and the output level can be modified more accurately.

Eighth Embodiment

Figure 18:
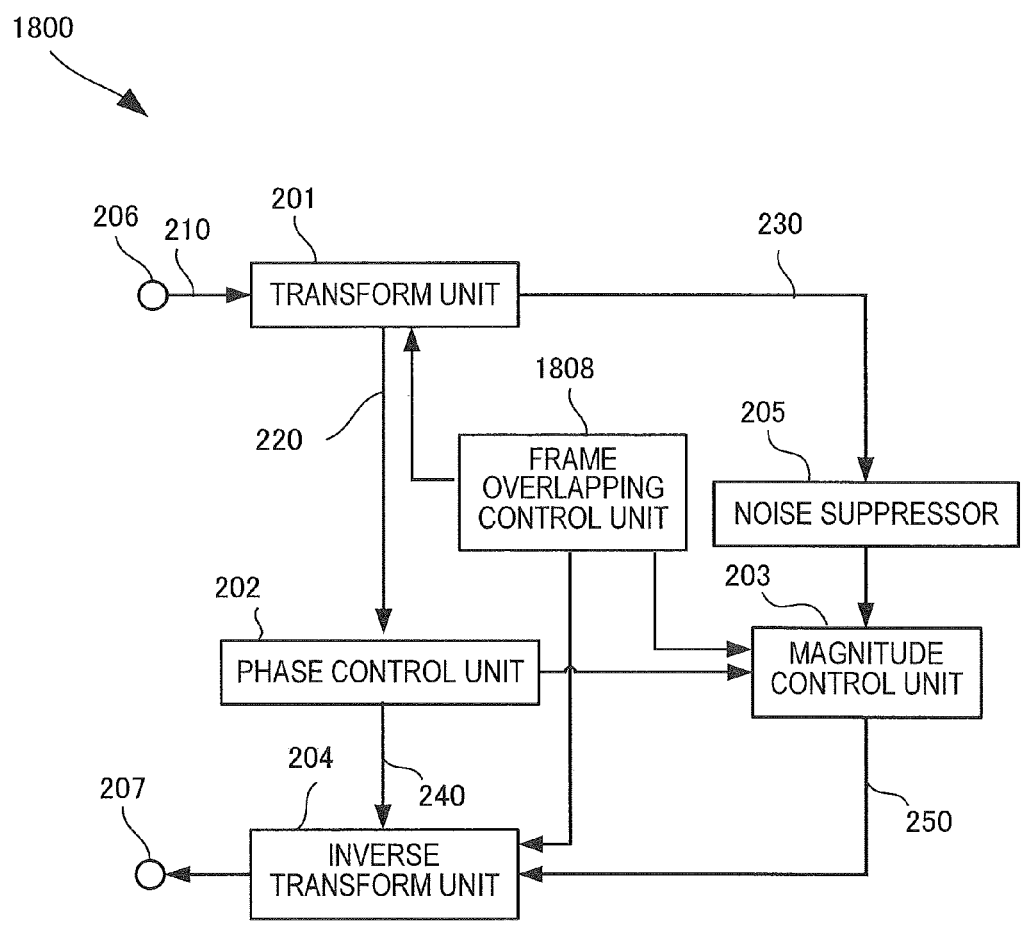
FIG. 18 is a block diagram showing the schematic arrangement of a noise suppression apparatus according to the eighth embodiment of the present invention.

The eighth embodiment of the present invention will be described with reference to FIG. 18. In FIG. 18, a frame overlapping control unit 1808 is added to the arrangement of the second embodiment. The frame overlapping control unit 1808 controls an overlapping ratio when frame division and reconstruction are performed in a transform unit 201 and inverse transform unit 204, and supplies the overlapping ratio to a magnitude control unit 203. As described above, overlapping causes a level drop in phase replacement. The amount of level drop changes depending on the overlapping ratio. As the overlapping ratio increases, the drop amount also increases. Therefore, when the overlapping ratio changes, the magnitude modification amount needs to be controlled.

More specifically, the modification amount is obtained by using, as a reference, the magnitude modification amount G for an overlapping ratio of 50%. When the overlapping ratio is 0%, no magnitude modification is necessary. When the overlapping ratio is 50%, the magnitude modification amount is G. From this, the magnitude modification amount is given by equation (50) using the ratio of a frame length L and overlapping length Q:

$$G' = \left(1 - \frac{2Q}{L}\right) \cdot 1 + \frac{2Q}{L} G = 1 + \frac{2Q}{L}(G-1) \tag{50}$$

where G' is the magnitude modification amount when modification based on the overlapping ratio is performed.

For example, since Q=L/2 for the overlapping ratio of 50%, equation (51) is established:

$$G' = 1 + \frac{2\frac{L}{2}}{L}(G-1) = 1 + G - 1 = G \tag{51}$$

Since Q=L/4 for the overlapping ratio of 25%, equation (52) is established:

$$G' = 1 + \frac{2\frac{L}{4}}{L}(G-1) = 1 + \frac{1}{2}G - \frac{1}{2} = \frac{1}{2} + \frac{1}{2}G \tag{52}$$

The magnitude control unit 203 modifies a modification coefficient transmitted from a phase control unit 202 based on equation (50), and modifies an enhanced signal magnitude spectrum. In the eighth embodiment, the arrangement and operation except for the frame overlapping control unit 1808 are the same as those in the second embodiment, and a description thereof will not be repeated.

According to the eighth embodiment, in addition to the effects of the second embodiment, the frame overlapping ratio can be freely set.

Ninth Embodiment

Figure 19:
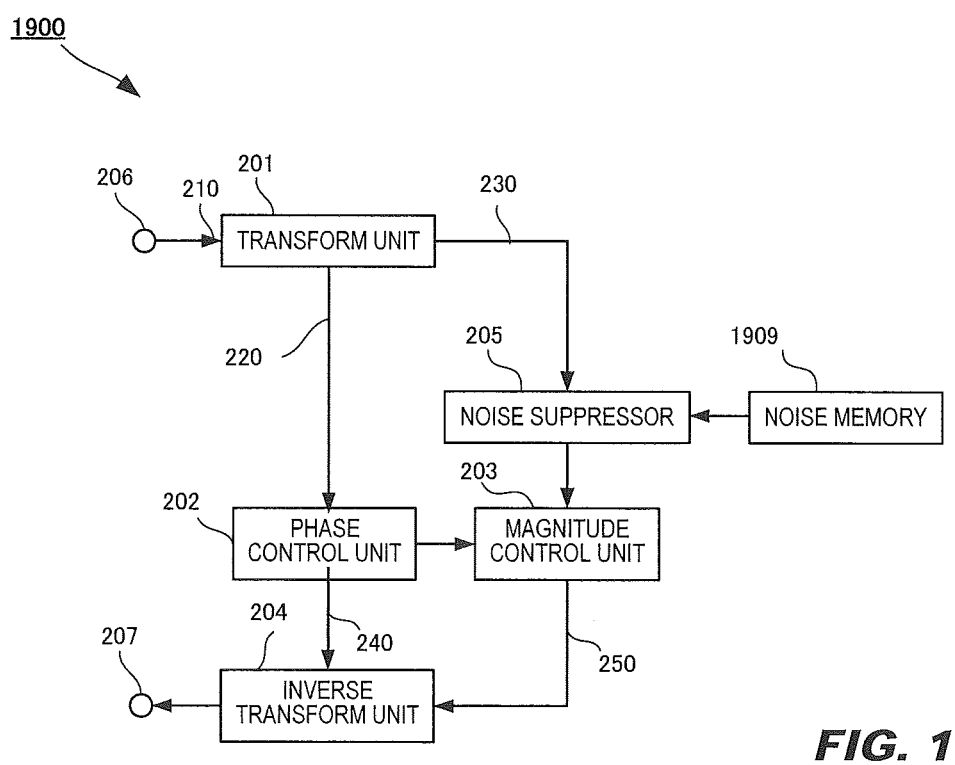
FIG. 19 is a block diagram showing the schematic arrangement of a noise suppression apparatus according to the ninth embodiment of the present invention.

The ninth embodiment of the present invention will be described with reference to FIG. 19. In FIG. 19, a noise memory 1909 is connected to a noise suppressor 205. The ninth embodiment suppresses noise by using a known noise spectrum. The noise memory 1909 stores the spectrum of noise to be suppressed. The noise suppressor 205 suppresses noise based on the stored noise spectrum, and can suppress only target noise.

A noise spectrum to be stored can be, for example, the average spectrum, maximum spectrum, or minimum spectrum of noise, or a combination of them. In the ninth embodiment, the arrangement and operation except for the noise memory 1909 are the same as those in the second embodiment, and a description thereof will not be repeated.

According to the ninth embodiment, the effects of the second embodiment can be applied to only specific noise. When noise to be suppressed is obvious, a higher-quality enhanced signal can be obtained.

Other Embodiments

Although the first to ninth embodiments have described noise suppression apparatuses having different features, a noise suppression apparatus having a combination of these features also falls within the scope of the present invention.

The present invention can be applied to a system including plural devices or a single apparatus. The present invention can be applied to a case in which a software signal processing program for implementing the functions of the embodiments is supplied to the system or apparatus directly or from a remote site. Hence, the program installed in a computer to implement the functions of the present invention by the computer, a medium storing the program, or a WWW (World Wide Web) server to download the program is also incorporated in the present invention.

Figure 20:
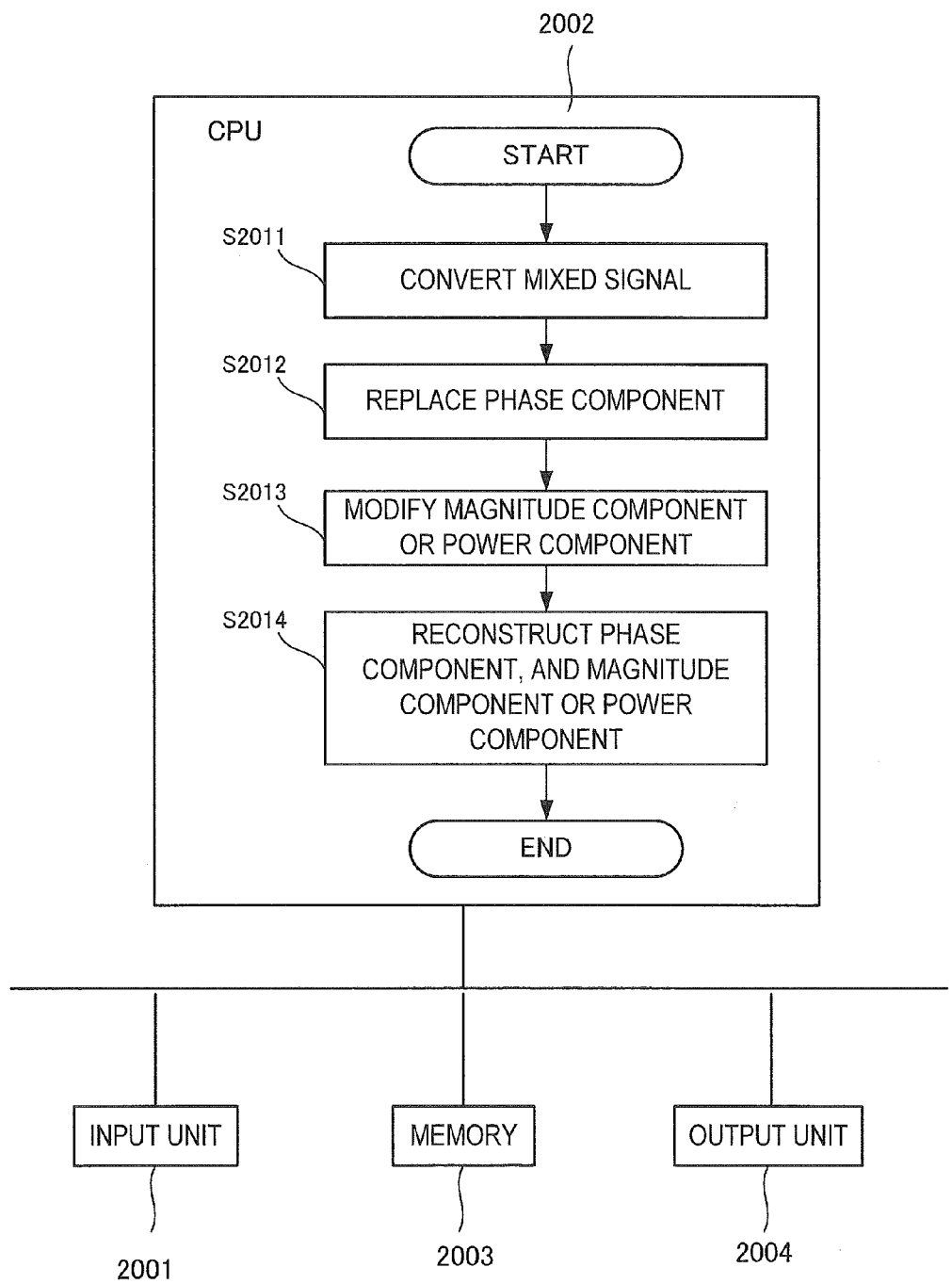
FIG. 20 is a block diagram showing the schematic arrangement of a noise suppression apparatus according to another embodiment of the present invention.

FIG. 20 is a view showing the arrangement of a computer 2000 which executes a signal processing program when the first embodiment is implemented by the signal processing program. The computer 2000 includes an input unit 2001, CPU 2002, output unit 2003, and memory 2004.

The CPU 2002 controls the operation of the computer 2000 by loading the signal processing program. More specifically, the CPU 2002 executes the signal processing program stored in the memory 2004, and transforms a mixed signal in which the first and second signals coexist, into a phase component and a magnitude component or power component for each frequency (step S2011). Then, the CPU 2002 replaces a phase component of a predetermined frequency (step S2012). The CPU 2002 modifies a magnitude component or power component of the predetermined frequency in accordance with the amount of a change of the magnitude component or power component in an output signal that arises from replacement of the phase component (step S2013). The CPU 2002 reconstructs the phase component replaced in step S2012 and the magnitude component or power component modified in step S2013 (step S2014).

Accordingly, the same effects as those of the first embodiment can be obtained.

Other Exemplary Embodiments

Some or all of the above-described embodiments can also be described as in the following further exemplary embodiments, but are not limited to the followings.

Further Exemplary Embodiment 1

There is provided a signal processing apparatus comprising:
a transform unit that transforms a mixed signal in which a first signal and a second signal coexist, into a phase component and a magnitude component or power component for each frequency;
a first control unit that replaces the phase component of a predetermined frequency;
a second control unit that modifies the magnitude component or power component of the predetermined frequency in accordance with an amount of a change of the magnitude component or power component that arises from replacement by the first control unit; and
a reconstruction unit that reconstructs the phase component replaced by the first control unit and the magnitude component or power component modified by the second control unit.

Further Exemplary Embodiment 2

There is provided the signal processing apparatus according to Further exemplary embodiment 1, wherein
the first control unit includes a replacement amount generation unit that generates a replacement amount of the phase component, and
the second control unit calculates the change amount based on the replacement amount provided from the replacement amount generation unit, and modifies the magnitude component or power component in accordance with the calculated change amount.

Further Exemplary Embodiment 3

There is provided the signal processing apparatus according to Further exemplary embodiment 1, wherein the second control unit includes a phase component delay unit that delays the phase component, calculates the change amount by comparing phase components before and after delay, and modifies the magnitude component or power component in accordance with the calculated change amount.

Further Exemplary Embodiment 4

There is provided the signal processing apparatus according to Further exemplary embodiment 1, wherein the second control unit calculates the change amount by comparing an output from the reconstruction unit with the mixed signal, and modifies the magnitude component or power component in accordance with the calculated change amount.

Further Exemplary Embodiment 5

There is provided the signal processing apparatus according to Further exemplary embodiment 4, wherein the second control unit calculates the change amount by comparing an average value of an output from the reconstruction unit with an average value of the mixed signal, and modifies the magnitude component or power component in accordance with the calculated change amount.

Further Exemplary Embodiment 6

There is provided the signal processing apparatus according to Further exemplary embodiment 1, further comprising a magnitude component delay unit that delays the magnitude component or power component,
wherein the second control unit calculates the change amount by comparing an output from the reconstruction unit with the mixed signal, and modifies the magnitude component or power component delayed by the magnitude component delay unit in accordance with the calculated change amount.

Further Exemplary Embodiment 7

There is provided the signal processing apparatus according to any one of Further exemplary embodiments 1 to 6, wherein
the transform unit includes a division unit that divides the mixed signal into a plurality of frames partially overlapping each other, and
the second control unit further modifies the magnitude component or power component of the predetermined frequency in accordance with a frame overlapping ratio.

Further Exemplary Embodiment 8

There is provided the signal processing apparatus according to any one of Further exemplary embodiments 1 to 7, wherein the first control unit includes a rotation amount restriction unit that restricts an amount of rotation from a phase before replacement that arises from replacement of the phase component.

Further Exemplary Embodiment 9

There is provided a signal processing method comprising:
transforming a mixed signal in which a first signal and a second signal coexist, into a phase component and a magnitude component or power component for each frequency;
replacing the phase component of a predetermined frequency;
modifying the magnitude component or power component of the predetermined frequency in accordance with an amount of a change of the magnitude component or power component that arises from replacement in the replacing; and reconstructing the phase component replaced in the replacing and the magnitude component or power component modified in the modifying.

Further Exemplary Embodiment 10

There is provided a non-transitory computer-readable storage medium storing a signal processing program that causes a computer to execute:

transforming a mixed signal in which a first signal and a second signal coexist, into a phase component and a magnitude component or power component for each frequency;

replacing the phase component of a predetermined frequency;

modifying the magnitude component or power component of the predetermined frequency in accordance with an amount of a change of the magnitude component or power component that arises from replacement in the replacing; and reconstructing the phase component replaced in the replacing and the magnitude component or power component modified in the modifying.

OTHERS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-041002 filed on Feb. 26, 2011, which is hereby incorporated by reference herein in its entirety.

The invention claimed is:

1. A signal processing apparatus, comprising:
a processor and a memory, wherein:
the processor receives a series of samples of a mixed signal in which a target signal and a noise signal coexist and divides the series of samples into frames,
the processor functions as a transform unit that transforms the samples of each frame into a phase component and a magnitude component or power component for each frequency of the mixed signal;
the processor functions as a noise suppressor that suppresses the noise signal in the magnitude component or power component;
the processor functions as a first control unit that replaces the phase component at a predetermined frequency;
the processor functions as a second control unit that modifies the magnitude component or power component at the predetermined frequency in accordance with an amount of a change in the magnitude component or power component that arises from replacement by said first control unit; and
the processor functions as a first reconstruction unit that reconstructs the phase component replaced by said first control unit and the magnitude component or power component modified by said second control unit of at least two adjacent frames to generate a noise suppressed output signal.

2. The signal processing apparatus according to claim 1, wherein said first control unit includes a replacement amount generation unit that generates a replacement amount of the phase component, and
wherein said second control unit calculates the amount of the change based on the replacement amount provided from the replacement amount generation unit, and modifies the magnitude component or power component in accordance with the calculated amount of the change.

3. The signal processing apparatus according to claim 1, wherein said second control unit includes a phase component delay unit that delays the replaced phase component, calculates the amount of the change by comparing phase components before and after delay, and modifies the magnitude component or power component in accordance with the calculated amount of the change.

4. The signal processing apparatus according to claim 1, wherein said second control unit calculates the amount of the change in addition to comparing an output from said first reconstruction unit with the mixed signal, and modifies the magnitude component or power component in accordance with the calculated amount of the change.

5. The signal processing apparatus according to claim 4, wherein said second control unit calculates the amount of the change by comparing an average value of an output from said first reconstruction unit with an average value of the mixed signal, and modifies the magnitude component or power component in accordance with the calculated amount of the change.

6. The signal processing apparatus according to claim 1, further comprising a magnitude component delay unit that delays the magnitude component or power component, and a second reconstruction unit that reconstructs the phase component replaced by said first control unit and the magnitude component or power component transformed by said transform unit,
wherein said second control unit calculates the amount of the change in addition to comparing an output from said second reconstruction unit with the mixed signal, and modifies the magnitude component or power component delayed by said magnitude component delay unit in accordance with the calculated amount of the change.

7. The signal processing apparatus according to claim 1, wherein said transform unit includes a division unit that divides the mixed signal into a plurality of frames partially overlapping each other, and
wherein said second control unit further modifies the magnitude component or power component at the predetermined frequency in accordance with a frame overlapping ratio.

8. The signal processing apparatus according to claim 1, wherein said first control unit includes a rotation amount restriction unit that restricts an amount of rotation from a phase before replacement that arises from replacement of the phase component.

9. The signal processing apparatus according to claim 1, wherein said first control unit includes a replacement amount generation unit that generates a replacement amount of the phase component.

10. The signal processing apparatus according to claim 1, wherein said second control unit calculates the amount of the change based on a replacement amount of the phase component.

11. The signal processing apparatus according to claim 10, wherein said second control unit modifies the magnitude component or power component in accordance with the calculated amount of the change.

12. The signal processing apparatus according to claim 1, wherein said second control unit calculates the amount of the change in addition to comparing an output from said reconstruction unit with the mixed signal.

13. The signal processing apparatus according to claim 1, wherein said second control unit calculates the amount of the change by comparing an average value of an output from said reconstruction unit with an average value of the mixed signal.

14. The signal processing apparatus according to claim 13, wherein said second control unit modifies the magnitude component or power component in accordance with the calculated amount of the change.

15. The signal processing apparatus according to claim 1, further comprising a magnitude component delay unit that delays the magnitude component or power component.

16. The signal processing apparatus according to claim 1, wherein said second control unit calculates the amount of the change by comparing an output from said reconstruction unit with the mixed signal.

17. The signal processing apparatus according to claim 16, wherein said second control unit modifies the magnitude component or power component delayed in accordance with the calculated amount of the change.

18. The signal processing apparatus according to claim 1, wherein said transform unit includes a division unit that divides the mixed signal into a plurality of frames partially overlapping each other.

19. A computer-implemented signal processing method comprising:
    receiving, by a processor, a series of samples of a mixed signal in which a target signal and a noise signal coexist and dividing the series of samples into frames,
    transforming the samples of each frame into a phase component and a magnitude component or power component for each frequency of the mixed signal;
    suppressing the noise signal in the magnitude component or power component;
    replacing the phase component of a predetermined frequency;
    modifying the magnitude component or power component of the predetermined frequency in accordance with an amount of a change of the magnitude component or power component that arises from replacement in the replacing; and
    reconstructing the phase component replaced in the replacing and the magnitude component or power component modified in the modifying of at least two adjacent frames to generate a noise suppressed output signal.

20. A non-transitory computer-readable storage medium storing a signal processing program that causes a computer to execute:
    receiving, by a processor, a series of samples of a mixed signal in which a target signal and a noise signal coexist and dividing the series of samples into frames,
    transforming the samples of each frame into a phase component and a magnitude component or power component for each frequency of the mixed signal;
    suppressing the noise signal in the magnitude component or power component;
    replacing the phase component of a predetermined frequency;
    modifying the magnitude component or power component of the predetermined frequency in accordance with an amount of a change of the magnitude component or power component that arises from replacement in the replacing; and
    reconstructing the phase component replaced in the replacing and the magnitude component or power component modified in the modifying of at least two adjacent frames to generate a noise suppressed output signal.

* * * * *